US011990362B2

(12) United States Patent
Hidaka et al.

(10) Patent No.: US 11,990,362 B2
(45) Date of Patent: May 21, 2024

(54) COMPOSITE SINTERED BODY, ELECTROSTATIC CHUCK MEMBER, ELECTROSTATIC CHUCK DEVICE, AND METHOD FOR MANUFACTURING COMPOSITE SINTERED BODY

(71) Applicant: SUMITOMO OSAKA CEMENT CO., LTD., Tokyo (JP)

(72) Inventors: Nobuhiro Hidaka, Tokyo (JP); Megumi Ootomo, Tokyo (JP); Jun Arikawa, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 407 days.

(21) Appl. No.: 17/612,173

(22) PCT Filed: May 21, 2020

(86) PCT No.: PCT/JP2020/020174
§ 371 (c)(1),
(2) Date: Nov. 17, 2021

(87) PCT Pub. No.: WO2020/235651
PCT Pub. Date: Nov. 26, 2020

(65) Prior Publication Data
US 2022/0223455 A1 Jul. 14, 2022

(30) Foreign Application Priority Data

May 22, 2019 (JP) .................................. 2019-096046
May 22, 2019 (JP) .................................. 2019-096053

(51) Int. Cl.
*H01L 21/68* (2006.01)
*C04B 35/505* (2006.01)
(Continued)

(52) U.S. Cl.
CPC ........ *H01L 21/6833* (2013.01); *C04B 35/505* (2013.01); *C04B 35/565* (2013.01);
(Continued)

(58) Field of Classification Search
CPC ... C04B 35/505; C04B 35/565; C04B 35/645; C04B 2235/549; H01L 21/6833; H01L 21/68757
See application file for complete search history.

(56) References Cited

U.S. PATENT DOCUMENTS 4,681,861 A * 7/1987 Saito .................... C04B 35/565
501/91
2009/0197073 A1* 8/2009 Nakayama ............ C04B 35/117
428/325

(Continued)

FOREIGN PATENT DOCUMENTS

JP            4744855 B2    8/2011
WO    2017/122716 A1    7/2017

(Continued)

OTHER PUBLICATIONS

Office Action for Japanese Patent Application No. 2021-520859, (dated Jan. 11, 2022).
International Search Report for PCT/JP2020/020174 (dated Aug. 4, 2020).

*Primary Examiner* — Jue Zhang
*Assistant Examiner* — Lakaisha Jackson
(74) *Attorney, Agent, or Firm* — Merchant & Gould P.C.

(57) ABSTRACT

A composite sintered body including: a metal oxide as a main phase; silicon carbide as a sub-phase; and silicate of a metal element that is included in the metal oxide, in which the average aggregation diameter of the silicate in the field of view of 600 $\mu m^2$ at a magnification of 1000 times is 5 $\mu m$ or lower.

19 Claims, 11 Drawing Sheets

(51) Int. Cl.
  *C04B 35/565* (2006.01)
  *C04B 35/645* (2006.01)
  *H01J 37/32* (2006.01)
  *H01L 21/683* (2006.01)
  *H01L 21/687* (2006.01)

(52) U.S. Cl.
  CPC ...... *C04B 35/645* (2013.01); *H01J 37/32724* (2013.01); *H01L 21/68757* (2013.01); *C04B 2235/549* (2013.01); *H01J 2237/334* (2013.01)

(56) References Cited

U.S. PATENT DOCUMENTS

2010/0327204 A1* 12/2010 Yashima ............... C04B 35/565
　　　　　　　　　　　　　　　　　　251/304
2015/0251957 A1*  9/2015 Funaki ................ F16C 33/145
　　　　　　　　　　　　　　　　　　501/87
2016/0109125 A1*  4/2016 Willkens ............... F27D 19/00
　　　　　　　　　　　　　　　　　　219/270

FOREIGN PATENT DOCUMENTS

WO　　2018/181130 A1　10/2018
WO　　2019/004402 A1　 1/2019

* cited by examiner

COMPOSITE SINTERED BODY, ELECTROSTATIC CHUCK MEMBER, ELECTROSTATIC CHUCK DEVICE, AND METHOD FOR MANUFACTURING COMPOSITE SINTERED BODY

TECHNICAL FIELD

The present invention relates to a composite sintered body, an electrostatic chuck member, an electrostatic chuck device, and a method for manufacturing a composite sintered body.

The present application is a U.S. National Stage Application under 35 U.S.C. § 371 of International Patent Application No. PCT/JP2020/020174, filed on May 21, 2020, which claims benefit of priority to Japanese Patent Application No. 2019-096053, filed on May 22, 2019 and Japanese Patent Application No. 2019-096046, filed on May 22, 2019, the disclosures of all of which are hereby incorporated by reference in their entireties.

BACKGROUND

In a semiconductor manufacturing apparatus which performs a plasma process, an electrostatic chuck device is used in which a plate-shaped sample (a wafer) can be easily mounted on and fixed to a sample stage and a temperature of the wafer can be maintained at a desired temperature. The electrostatic chuck device is provided with a base having one principal surface serving as a placing surface on which the wafer is placed, and an electrostatic attraction electrode that generates an electrostatic force (Coulomb's force) between itself and the wafer placed on the placing surface (refer to, for example, Patent Literature No. 1). The base is usually formed using a ceramics sintered body as a forming material.

In such an electrostatic chuck device, the wafer is fixed by using the electrostatic force generated between the wafer and the electrostatic attraction electrode. Specifically, in the electrostatic chuck device, when fixing the wafer, voltage is applied to the electrostatic attraction electrode to generate an electrostatic force between the wafer and the electrostatic attraction electrode. On the other hand, when removing the wafer fixed to the placing surface, the application of the voltage to the electrostatic attraction electrode is stopped to make the electrostatic force between the wafer and the electrostatic attraction electrode disappear.

CITATION LIST

Patent Literature

[Patent Literature No. 1] Japanese Patent No. 4744855

SUMMARY OF INVENTION

Technical Problem

In an electrostatic chuck device that is exposed to a plasma process, a base is inevitably damaged by plasma (subjected to plasma erosion). In this case, in a configuration in which a portion of the base is particularly susceptible to erosion by plasma, the portion susceptible to the erosion by plasma is damaged in advance of the surroundings, so that there is a possibility that the life of the base may be shortened. Therefore, improvement is required.

Further, in an electrostatic chuck device, in order to reduce an in-plane temperature distribution (temperature difference) of a wafer, a technique for cooling the wafer placed on a sample stage by providing fine grooves in the sample stage and making a gaseous refrigerant (for example, helium) flow in the grooves is known. In order to increase temperature uniformity in such an electrostatic chuck device, it is conceivable to improve cooling efficiency by increasing a gas pressure of the refrigerant. On the other hand, in a case of increasing the gas pressure of the refrigerant, the electrostatic chuck device is required to have a high attraction force such that the wafer does not come off due to the pressure that is received from the refrigerant. In order to obtain the high attraction force, it is preferable that the dielectric constant of the base of the electrostatic chuck device is high.

Further, in recent years, devices using semiconductors have tended to be highly integrated, and microfabrication technology with respect to various materials such as wires or insulating layers has been required at the time of device manufacturing. At that time, a management temperature of the wafer is different between a case where a dielectric that is used for the insulating layer is dry-etched and a case where metal that is used for the wire is dry-etched. Therefore, an electrostatic chuck device that suitably holds a wafer in a wide temperature range and enables dry etching is required.

In order to allow microfabrication by dry etching to be reliably performed, it is required to suppress scattering of incident ions during etching and to make the incident ions incident on a desired position. Therefore, in recent years, in a semiconductor manufacturing apparatus using an electrostatic chuck device, the frequency of a bias (RF) voltage has been reduced.

However, if the frequency of the bias voltage is reduced, the electrical characteristics of the base made of a ceramics sintered body in the electrostatic chuck device change as compared with a case where the bias voltage has a high frequency. Specifically, if an alternating-current voltage having a low frequency is applied, the electrical characteristics of the base are strongly affected by a volume resistivity value (unit: $\Omega \cdot cm$). There is a relationship in which the smaller the volume resistivity value, the larger the dielectric loss tangent that depends on the volume resistivity value becomes.

If the dielectric loss tangent of the base becomes large, the base tends to generate heat when an alternating-current voltage is applied, and therefore, improvement is required.

The present invention has been made in view of such circumstances, and has an object to provide a composite sintered body which is less susceptible to local plasma erosion. That is, the present invention has an object to provide a composite sintered body in which damage is uniform and mild even if it is subjected to plasma erosion. Further, the present invention has an object to provide a composite sintered body for an electrostatic chuck, which has both a high dielectric constant and a low dielectric loss tangent in a wide temperature range.

Further, the present invention has an object to provide an electrostatic chuck member and an electrostatic chuck device using the composite sintered body as described above. Further, the present invention has an object to provide a method for manufacturing a composite sintered body, which allows such a composite sintered body to be easily manufactured.

Solution to Problem

In order to solve the above problems, according to a first aspect of the present invention, there is provided a composite sintered body including: a metal oxide as a main phase, silicon carbide as a sub-phase, and silicate of a metal element that is included in the metal oxide, in which an average aggregation diameter of the silicate in a field of view of 600 μm² at a magnification of 1000 times is 5 μm or lower.

The composite sintered body according to the first aspect of the present invention preferably has the following features. It is also preferable that the following features are combined with each other.

In the first aspect of the present invention, in the field of view, a ratio of an area of a region occupied by the silicate to a total area of a region occupied by the metal oxide and a region occupied by the silicon carbide may be 30% or less.

In the first aspect of the present invention, the composite sintered body may have an average hardness of $2 \times 10^4$ N/mm² or higher and an average Young's modulus of $3.5 \times 10^5$ N/mm² or higher.

In the first aspect of the present invention, crystal grains of the silicon carbide may be dispersed in the crystal grains of the metal oxide and dispersed at crystal grain boundaries of the metal oxide, and a proportion of an area of the crystal grains of the silicon carbide which are dispersed in the crystal grains of the metal oxide may be 25% or more with respect to a total area of the crystal grains of the silicon carbide, in terms of an area ratio.

In the first aspect of the present invention, the metal oxide may be aluminum oxide or yttrium oxide.

In the first aspect of the present invention, an average crystal grain size of the metal oxide may be 1.2 μm or higher and 10 μm or lower.

According to a second aspect of the present invention, there is provided an electrostatic chuck member including: a plate-shaped base which is formed using the composite sintered body according to the first aspect as a forming material, and which has one principal surface serving as a placing surface on which a plate-shaped sample is placed; and an electrostatic attraction electrode provided on a side opposite to the placing surface of the base or in an interior of the base.

The second aspect of the present invention provides an electrostatic chuck device including the electrostatic chuck member described above.

According to a third aspect of the present invention, there is provided a method for manufacturing a composite sintered body, including: a pre-oxidation step of oxidizing surfaces of silicon carbide particles; a step of obtaining slurry that includes a dispersion medium, by injecting the silicon carbide particles treated in the pre-oxidation step and metal oxide particles to mix the silicon carbide particles and the metal oxide particles while causing the silicon carbide particles and the metal oxide particles to collide with each other; a step of adjusting pH of the slurry so as to be included in a pH range in which surface charges of the metal oxide particles in the slurry become positive and surface charges of the silicon carbide particles in the slurry become negative, after a dispersant is added to the slurry; a step of obtaining granules that include the metal oxide particles and the silicon carbide particles by removing the dispersion medium from the pH-adjusted slurry; a step of oxidizing surfaces of the granules by heating the granules at a temperature of 300° C. or higher and 600° C. or lower in a non-oxidative atmosphere, and then heating the granules in an oxidative atmosphere; a step of obtaining a formed body by forming the oxidized granules; and a step of pressure-sintering the formed body by heating the formed body to a temperature of 1600° C. or higher while compacting the formed body at a pressure of 25 MPa or higher, in a non-oxidative atmosphere.

In order to solve the above problems, according to a fourth aspect of the present invention, there is provided a composite sintered body including: a metal oxide as a main phase; and silicon carbide as a sub-phase, in which both a relative dielectric constant thereof at 200 Hz and a relative dielectric constant thereof at 1 MHz are 10 or higher in an entire range of 24° C. or higher and 400° C. or lower, and both a dielectric loss tangent thereof at 200 Hz and a dielectric loss tangent thereof at 1 MHz are 0.04 or lower in an entire range of 24° C. or higher and 400° C. or lower.

The composite sintered body according to the fourth aspect of the present invention preferably has the following features. It is also preferable that the following features are combined with each other.

In the fourth aspect of the present invention, with respect to the relative dielectric constant thereof at 200 Hz, a difference between a maximum value and a minimum value in a range of 24° C. or higher and 400° C. or lower may be 6 or lower.

In the fourth aspect of the present invention, a volume resistance value (volume resistivity) thereof may be $1 \times 10^{-13}$ Ω·cm or higher in an entire range of 24° C. or higher and 400° C. or lower.

In the fourth aspect of the present invention, the metal oxide may be aluminum oxide or yttrium oxide.

In the fourth aspect of the present invention, an average crystal grain size of the metal oxide may be 1.2 μm or higher and 10 μm or lower.

According to a fifth aspect of the present invention, there is provided an electrostatic chuck member including: a plate-shaped base which is formed using the above composite sintered body as a forming material, and which has one principal surface serving as a placing surface on which a plate-shaped sample is placed; and an electrostatic attraction electrode provided on a side opposite to the placing surface of the base or in an interior of the base.

According to a sixth aspect of the present invention, there is provided an electrostatic chuck device including the electrostatic chuck member described above.

Advantageous Effects of Invention

According to the present invention, it is possible to provide a composite sintered body which is less susceptible to partially large, that is, local plasma erosion. According to the present invention, it is possible to provide a composite sintered body for an electrostatic chuck, which has both the high dielectric constant and the low dielectric loss tangent in a wide temperature range. Further, it is possible to provide an electrostatic chuck member and an electrostatic chuck device using such a composite sintered body. Further, it is possible to provide a method for manufacturing a composite sintered body, which allows such a composite sintered body to be easily manufactured.

DESCRIPTION OF EMBODIMENTS

Figure 1:
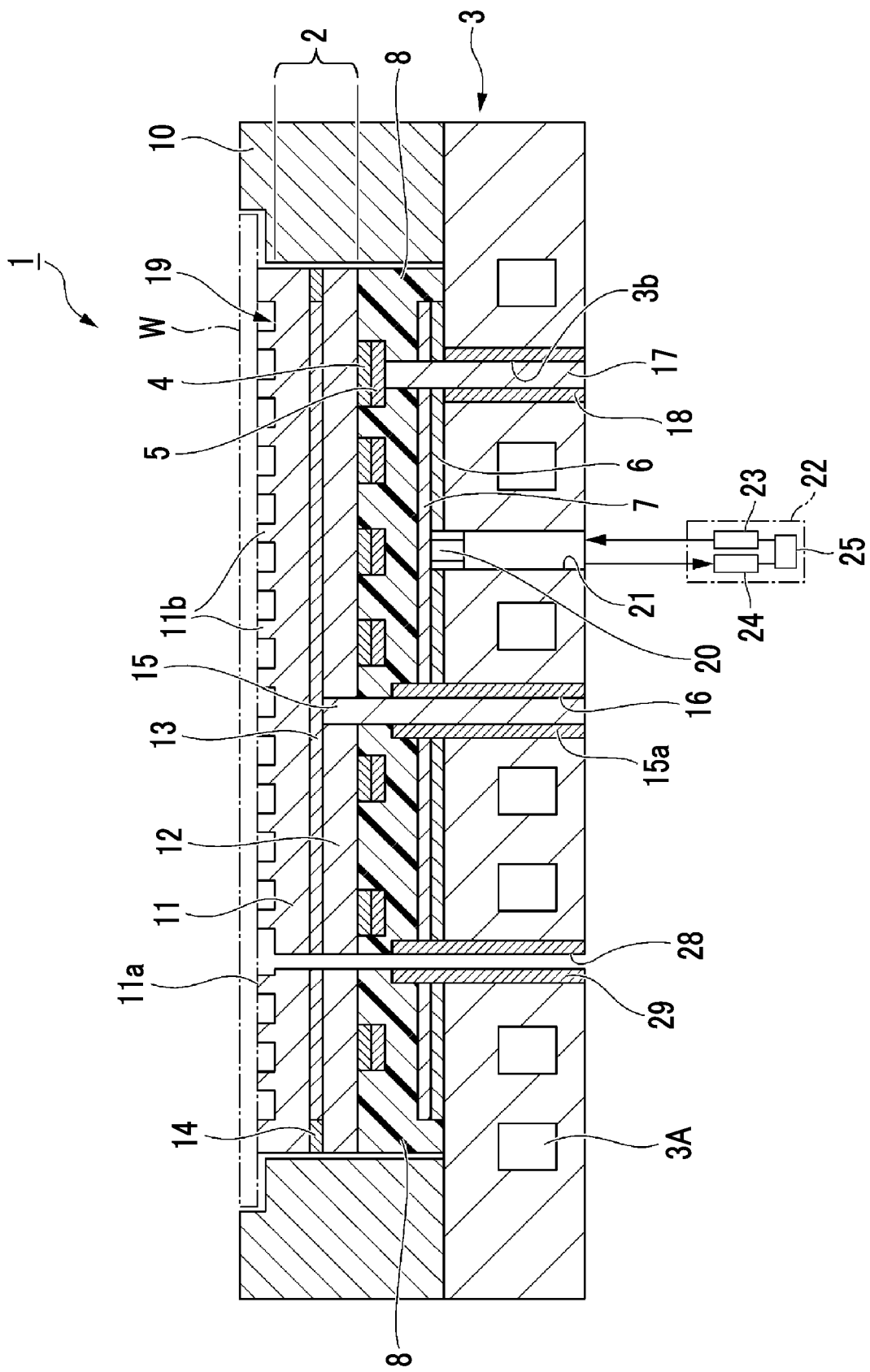
FIG. 1 is a schematic sectional view showing a preferred example of an electrostatic chuck device in first and second embodiments.

Hereinafter, preferred examples of a composite sintered body, an electrostatic chuck device, and a method for manufacturing a composite sintered body according to the present invention will be described. The following description is a description for better understanding of the gist of the invention, and does not limit the present invention unless otherwise specified. The number, quantity, position, size, numerical value, ratio, order, type, and the like can be changed, omitted, or added within a scope which does not depart from the present invention. Further, in the drawings that are used in the following description, there is a case where for convenience, a featured portion is enlarged and shown for the purpose of emphasizing the featured portion. Each aspect may share each other's preferred examples or conditions. The composite sintered bodies according to a first aspect and a fourth aspect can be suitably used as a material of a base of an electrostatic chuck device.

In the following description, an example of a preferable configuration of an electrostatic chuck device, which is the main purpose of use of the composite sintered bodies according to the first and fourth aspects, will be described. Thereafter, the details of the composite sintered body will be described.

In the following description, there is a case where a preferred example of a composite sintered body according to the first aspect is described as a first embodiment and a preferred example of a composite sintered body according to the fourth aspect is described as a second embodiment. Further, the composite sintered body according to the first aspect and the composite sintered body according to the fourth aspect can preferably share each other's conditions or preferable examples.

[Electrostatic Chuck Device]

Hereinafter, an electrostatic chuck device according to the present embodiment will be described with reference to FIG. 1. In all the following drawings, in order to make the drawings easy to see, the dimensions, ratios, and the like of each constituent element may be appropriately changed.

FIG. 1 is a schematic sectional view showing the electrostatic chuck device of the present embodiment. An electrostatic chuck device 1 of the present embodiment includes an electrostatic chuck part 2 having a disk shape when viewed in a plan view and having a placing surface on the one principal surface (upper surface) side, and a temperature adjusting base part 3 having a disk shape when viewed in a plan view, having a predetermined thickness, and provided below the electrostatic chuck part 2 to adjust the temperature of the electrostatic chuck part 2 to a desired temperature. Further, the electrostatic chuck part 2 and the temperature adjusting base part 3 are bonded to each other through an adhesive layer 8 provided between the electrostatic chuck part 2 and the temperature adjusting base part 3.

Hereinafter, each part will be described in order.

(Electrostatic Chuck Part)

The electrostatic chuck part 2 has a placing plate 11 having an upper surface serving as a placing surface 11a on which a plate-shaped sample W such as a semiconductor wafer is placed, a supporting plate 12 integrated with the placing plate 11 and supporting the bottom portion side of the placing plate 11, an electrostatic attraction electrode 13 provided between the placing plate 11 and the supporting plate 12, and an insulating material layer 14 which insulates the surroundings of the electrostatic attraction electrode 13.

The placing plate 11 and the supporting plate 12 correspond to a "base" in the present invention.

The electrostatic chuck part 2 includes the base and corresponds to an "electrostatic chuck member" in the present invention.

The placing plate 11 and the supporting plate 12 are disk-shaped members in which the shapes of superimposed surfaces are the same. Each of the placing plate 11 and the supporting plate 12 is made of a composite sintered body having excellent mechanical strength and durability against corrosive gas and plasma thereof. The composite sintered body that is the material for forming the placing plate 11 and the supporting plate 12 will be described in detail later.

A plurality of protrusion portions 11b each having a diameter smaller than the thickness of the plate-shaped sample are formed at predetermined intervals on the placing surface 11a of the placing plate 11. The protrusion portions 11b support the plate-shaped sample W.

The thickness of the entirety including the placing plate 11, the supporting plate 12, the electrostatic attraction electrode 13, and the insulating material layer 14, that is, the thickness of the electrostatic chuck part 2 can be optionally selected. However, it is preferable that the thickness is 0.7 mm or higher and 5.0 mm or lower, for example.

For example, if the thickness of the electrostatic chuck part 2 is 0.7 mm or higher, it becomes easy to secure the mechanical strength of the electrostatic chuck part 2. If the thickness of the electrostatic chuck part 2 is 5.0 mm or lower, the thermal capacity of the electrostatic chuck part 2 does not become too large, and thus the thermal responsiveness of the plate-shaped sample W placed thereon does not deteriorate, and since an increase in the heat transfer in a lateral direction of the electrostatic chuck part is suppressed, it becomes easy to maintain the in-plane temperature of the plate-shaped sample W at a desired temperature pattern. The thickness of each part described here is an example and is not limited to the range described above.

The electrostatic attraction electrode 13 is for being used as an electrostatic chucking electrode for generating electric charges and fixing the plate-shaped sample W with an electrostatic attraction force. The shape or size thereof is appropriately adjusted according to the use thereof.

The electrostatic attraction electrode 13 is formed of a material which is optionally selected. It is preferable that it is formed of, for example, conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body, or high melting point metal such as tungsten (W), tantalum (Ta), or molybdenum (Mo).

The thickness of the electrostatic attraction electrode 13 can be optionally selected and is not particularly limited. For example, the thickness of 0.1 μm or higher and 100 μm or lower can be selected, and the thickness of 5 μm or higher and 20 μm or lower is more preferable.

If the thickness of the electrostatic attraction electrode 13 is 0.1 μm or higher, sufficient electrical conductivity can be secured. If the thickness of the electrostatic attraction electrode 13 is 100 μm or lower, cracks due to a difference in coefficient of thermal expansion between the electrostatic attraction electrode 13, and the placing plate 11 and the supporting plate 12 are not formed in the joint interface between the electrostatic attraction electrode 13, and the placing plate 11 and the supporting plate 12.

The electrostatic attraction electrode 13 having such a thickness can be easily formed by a film formation method such as a sputtering method or a vapor deposition method, or a coating method such as a screen printing method.

The insulating material layer 14 surrounds the electrostatic attraction electrode 13 to protect the electrostatic attraction electrode 13 from corrosive gas and plasma thereof. Further, the insulating material layer 14 is a layer that joins and integrates a boundary portion between the placing plate 11 and the supporting plate 12, that is, an outer peripheral portion region except for the electrostatic attraction electrode 13, and is formed of an insulating material having the same composition or the same main component as the material for forming the placing plate 11 and the supporting plate 12.

(Temperature Adjusting Base Part)

The temperature adjusting base part 3 is a member for adjusting the temperature of the electrostatic chuck part 2 to a desired temperature and is a member having a thick disk shape. As the temperature adjusting base part 3, for example, a liquid-cooling base or the like, in which a flow path 3A for circulating a refrigerant is formed in the interior thereof, is suitable.

As the material for forming the temperature adjusting base part 3, as long as it is metal which has excellent thermal conductivity, electrical conductivity, and workability, or a compound material which includes the metal, there is no particular limitation. For example, aluminum (Al), an aluminum alloy, copper (Cu), a copper alloy, stainless steel (SUS), or the like can be suitably used. It is preferable that at least the surface which is exposed to plasma, of the temperature adjusting base part 3, is subjected to alumite treatment or has an insulating film such as alumina formed thereon.

An insulating plate 7 is bonded to the upper surface side of the temperature adjusting base part 3 through an adhesion layer 6. The adhesion layer 6 is formed of a material which is optionally selected, for example, a sheet-shaped or film-shaped adhesive resin having heat resistance and insulation properties, such as polyimide resin, silicon resin, or epoxy resin. The adhesion layer is formed in a thickness in a range of about 5 to 100 μm, for example. The insulating plate 7 is made of a material which is optionally selected, for example, a thin plate, a sheet, or a film of resin having heat resistance, such as polyimide resin, epoxy resin, or acrylic resin.

The insulating plate 7 is not limited to a resin sheet or the like, may be, for example, an insulating ceramic plate, or may be a thermally sprayed film having insulation properties, such as alumina.

(Focus Ring)

A focus ring 10 is a member that has an annular shape when viewed in a plan view and is placed at a peripheral edge portion of the temperature adjusting base part 3. The focus ring 10 can be formed of, for example, a material having electrical conductivity equivalent to that of the wafer which is placed on the placing surface. By disposing the focus ring 10, it is possible to make an electrical environment with respect to plasma substantially coincide with that in the wafer at a peripheral edge portion of the wafer, and thus it is possible to make it difficult for a difference or bias in plasma treatment to occur between the central portion and the peripheral edge portion of the wafer.

(Other Members)

A power supply terminal 15 for applying a direct-current voltage to the electrostatic attraction electrode 13 is connected to the electrostatic attraction electrode 13. The power supply terminal 15 is inserted into a through-hole 16 penetrating the temperature adjusting base part 3, the adhesive layer 8, and the supporting plate 12 in a thickness direction. An insulator 15a having insulation properties is provided on the outer periphery side of the power supply terminal 15, and the power supply terminal 15 is insulated from the temperature adjusting base part 3 made of metal, by the insulator 15a.

In the example shown in the drawing, the power supply terminal 15 is shown as an integral member. However, the power supply terminal 15 may be configured by electrically connecting a plurality of members. The power supply terminal 15 is inserted into the temperature adjusting base part 3 and the supporting plate 12, which have different coefficients of thermal expansion. Therefore, for example, a portion which is inserted into the temperature adjusting base part 3 and a portion which is inserted into the supporting plate 12 may be formed of different materials.

As the material of the portion (extraction electrode) connected to the electrostatic attraction electrode 13 and inserted into the supporting plate 12, of the power supply terminal 15, as long as it is a conductive material having excellent heat resistance, there is no particular limitation. However, a material having a coefficient of thermal expansion which is close to the coefficients of thermal expansion of the electrostatic attraction electrode 13 and the supporting plate 12 is preferable. For example, it is preferable that the portion is made of a conductive ceramic material such as $Al_2O_3$—TaC.

The portion inserted into the temperature adjusting base part 3, of the power supply terminal 15, is preferably made of a metal material such as tungsten (W), tantalum (Ta), molybdenum (Mo), niobium (Nb), or a Kovar alloy, for example.

It is favorable if these two members are connected to each other with a material which is optionally selected, for example, a silicon-based conductive adhesive having flexibility and resistance to electricity.

A heater element 5 is provided on the lower surface side of the electrostatic chuck part 2. The heater element 5 can be optionally selected. However, it is preferably made by processing, for example, a non-magnetic metal thin plate having a constant thickness of 0.2 mm or lower, preferably about 0.1 mm. The heater element 5 can be obtained by processing, for example, a titanium (Ti) thin plate, a tungsten (W) thin plate, a molybdenum (Mo) thin plate, or the like into a desired heater shape, for example, a shape in which a band-like conductive thin plate meanders and the entire contour is an annular shape, by a photolithography method or laser processing.

The heater element 5 may be provided by bonding a non-magnetic metal thin plate to the electrostatic chuck part 2 and then processing and forming the thin plate on the surface of the electrostatic chuck part 2. Alternatively, the heater element 5 may be provided by preparing a thin plate processed and formed at a position different from the electrostatic chuck part 2 and transfer-printing it onto the surface of the electrostatic chuck part 2.

The heater element 5 is bonded and fixed to the bottom surface of the supporting plate 12 by an adhesion layer 4 which is made of a sheet-shaped or film-shaped silicon resin or acrylic resin having a uniform thickness and having heat resistance and insulation properties.

A power supply terminal 17 for supplying electric power to the heater element 5 is connected to the heater element 5. As the material for forming the power supply terminal 17, the same material as the material for forming the power supply terminal 15 described above can be used. The power supply terminal 17 is provided so as to pass through a through-hole 3b formed in the temperature adjusting base part 3. A tubular insulator 18 is provided between the power supply terminal 17 and the through-hole 3b and is made of an insulating material.

Further, a temperature sensor 20 is provided on the lower surface side of the heater element 5. In the electrostatic chuck device 1 of the present embodiment, an installation hole 21 is formed so as to penetrate the temperature adjusting base part 3 in the thickness direction. The temperature sensor 20 is installed at the uppermost portion of the installation hole 21. It is preferable that the temperature sensor 20 is installed at a position as close to the heater element 5 as possible. Therefore, a configuration may be made in which the temperature sensor 20 and the heater element 5 are brought closer to each other by extending and forming the installation hole 21 so as to protrude further toward the adhesive layer 8 side from the structure shown in the drawing.

The temperature sensor 20 can be optionally selected. It may be, for example, a fluorescent emission type temperature sensor in which a phosphor layer is formed on the upper surface side of a rectangular parallelepiped-shaped light transmission body made of quartz glass or the like. The temperature sensor 20 is bonded to the lower surface of the heater element 5 by a silicon resin-based adhesive or the like having translucency and heat resistance.

The phosphor layer is made of a material that generates fluorescence in response to heat input from the heater element 5. As the material for forming the phosphor layer, as long as it is a material generating fluorescence in response to heat generation, it is acceptable, and a wide variety of fluorescent materials can be selected. The material for forming the phosphor layer can be optionally selected. However, for example, a fluorescent material to which a rare earth element having an energy level suitable for light emission is added, a semiconductor material such as AlGaAs, a metal oxide such as magnesium oxide, and a mineral such as ruby or sapphire can be given. It is possible to use a material appropriately selected from these materials.

The temperature sensor 20 corresponding to the heater element 5 can be provided one or more as necessary. Each temperature sensor is provided at any position which does not interfere with the power supply terminal or the like and is in a circumferential direction of the lower surface of the heater element 5.

A temperature measurement part 22 which measures the temperature of the heater element 5 from the fluorescence of the temperature sensor 20 can be optionally selected. For example, the temperature measurement part 22 may be configured to include an excitation unit 23 which is located on the outside (the lower side) of the installation hole 21 of the temperature adjusting base part 3 and irradiates the phosphor layer with excitation light, a fluorescence detector 24 which detects the fluorescence emitted from the phosphor layer, and a control unit 25 which controls the excitation unit 23 and the fluorescence detector 24 and calculates the temperature of a main heater, based on the fluorescence.

Further, the electrostatic chuck device 1 has a gas hole 28 provided so as to penetrate from the temperature adjusting base part 3 to the placing plate 11 in the thickness direction thereof. A tubular insulator 29 is provided at an inner peripheral portion of the gas hole 28.

A gas supply device (cooling means) is connected to the gas hole 28. Cooling gas (heat transfer gas) for cooling the plate-shaped sample W is supplied from the gas supply device through the gas hole 28. The cooling gas is supplied to grooves 19 formed between the plurality of protrusion portions 11b on the upper surface of the placing plate 11 through the gas hole, and cools the plate-shaped sample W.

Further, the electrostatic chuck device 1 has a pin insertion hole (not shown) provided so as to penetrate from the temperature adjusting base part 3 to the placing plate 11 in the thickness direction thereof. As the pin insertion hole, for example, the same configuration as that of the gas hole 28 can be adopted. A lift pin for removal of the plate-shaped sample is inserted into the pin insertion hole.

The electrostatic chuck device 1 has the configuration as described above.

[Composite Sintered Body]

The composite sintered body according to the present invention includes a metal oxide as a main phase and silicon carbide as a sub-phase.

The composite sintered body of the first embodiment further includes silicate of a metal element that is included in the metal oxide, and the average aggregation diameter of the silicate in the field of view of 600 μm$^2$ at a magnification of 1000 times is 5 μm or lower.

The composite sintered body of the second embodiment may or may not further include silicate of a metal element that is included in the metal oxide, both the relative dielectric constant at 200 Hz and the relative dielectric constant at 1 MHz are 10 or higher in the entire range of 24° C. or higher and 400° C. or lower, and both the dielectric loss tangent at 200 Hz and the dielectric loss tangent at 1 MHz are 0.04 or lower in the entire range 24° C. or higher and 400° C. or lower.

The composite sintered bodies of the first embodiment and the second embodiment may share each other's preferable examples or conditions.

(Composite Sintered Body of First Embodiment)

Next, a preferred example of the composite sintered body of the first aspect, which preferably configures the base (the placing plate 11 and the supporting plate 12) of the first embodiment, will be described in detail.

The composite sintered body of the first embodiment includes a metal oxide as a main phase, silicon carbide as a sub-phase, and silicate of a metal element that is included in the metal oxide of the main phase. The base is made using a composite sintered body, which is ceramics that include the metal oxide, the silicon carbide, and the silicate, as a forming material.

As will be described in detail later, the silicate is generated by the reaction between a metal oxide particle and an oxide film ($SiO_2$ film) on the surface of a silicon carbide particle.

Further, in the composite sintered body of the present embodiment, the average aggregation diameter of the silicate in the field of view of 600 μm$^2$ at a magnification of 1000 times is 5 μm or lower.

In the present embodiment, the "average aggregation diameter of the silicate in the field of view of 600 μm$^2$ at a magnification of 1000 times" adopts the value of an average aggregation diameter that is obtained as follows.

First, the surface of a composite oxide (sintered body) is mirror-polished with diamond paste in which the average grain size of an abrasive grain is 3 μm (particle size indication: #8000).

Subsequently, with respect to the surface of the sintered body subjected to thermal etching, an electron image is taken using an electron beam probe microanalyzer, for example, an electron beam probe microanalyzer (model number JXA-8530F, manufactured by JEOL Ltd.). The magnification at the time of imaging is 1000 times. Further, an imaging range is a rectangle with an area of 600 μm$^2$.

The obtained electron micrograph is incorporated into image analysis type particle size distribution measurement software, for example, image analysis type particle size distribution measurement software (Mac-View Version4, manufactured by Mountech Co., Ltd.), and the aggregation diameter of silicate is calculated.

The above measurement is performed with respect to any five locations of the composite sintered body. The arithmetic mean value of the aggregation diameter of silicate obtained in each measurement is defined as the average aggregation diameter of silicate.

For example, in a case where the metal oxide is aluminum oxide, as an example of the "silicate", mullite such as $Al_8O_{12}Si_2$ or $Al_7O_{14}Si_2$ can be given. In a case where the metal oxide is yttrium oxide, as an examples of the "silicate", $Y_2O_3 \cdot SiO_2$, $Y_2O_3 \cdot 2SiO_2$, $2Y_2O_3 \cdot 3SiO_2$, or the like can be given.

Macroscopically, that is, in microscopic observation at a small magnification, each of the metal oxide, the silicon carbide, and the silicate that configure the composite sintered body is dispersed throughout the composite sintered body. Microscopically, that is, in microscopic observation at a large magnification, each of the metal oxide, the silicon carbide, and the silicate is aggregated at each place of the composite sintered body. In a case of comparing the metal oxide, the silicon carbide, and the silicate that configure the composite sintered body, the silicate has the lowest resistance to plasma. Therefore, in a case where the composite sintered body that includes the metal oxide, the silicon carbide, and the silicate is exposed to plasma, the portion where the silicate is aggregated is easily damaged.

In the composite sintered body of the present embodiment, the average aggregation diameter of the silicate is 5 μm or lower. Therefore, it is less susceptible to local large plasma erosion as compared with a composite sintered body that includes silicate large enough to have an average aggregation diameter exceeding 5 μm. Therefore, in an electrostatic chuck device using such a composite sintered body as a base, the life of the device can be extended.

In the composite sintered body of the present embodiment, the average aggregation diameter of the silicate is preferably 4 μm or lower, and more preferably 3 μm or lower. The average aggregation diameter may be 2.0 μm or lower, 1.0 μm or lower, or 0.5 μm or lower.

Figure 11:
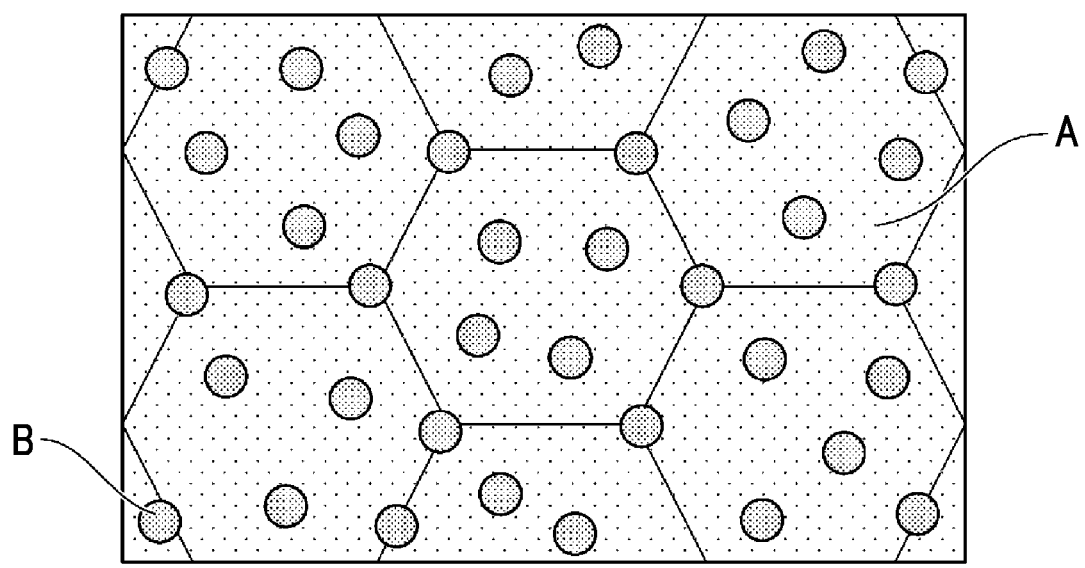
FIG. 11 is an explanatory diagram explaining the method for manufacturing the composite sintered body of the second embodiment.

In the composite sintered body of the present embodiment, it is preferable that the ratio of the area of a region occupied by the silicate to the total area of regions occupied by the metal oxide and the silicon carbide is 30% or less when observed in the field of view of 600 μm$^2$ at a magnification of 1000 times. The silicate has lower plasma resistance as compared with the metal oxide or the silicon carbide. Therefore, when exposed to plasma, it is susceptible to plasma erosion. Therefore, the lower the ratio of the area of the region occupied by the silicate, the better. The area ratio is more preferably 25% or less, further preferably 15% or less, and particularly preferably 10% or less. It is also preferable that it is 5% or less or 3% or less. In a case where the area of the region occupied by the silicate is 0%, for example, the composite sintered body as shown in FIG. 11 is formed. However, because withstand voltage is lowered, a sintered body in which silicate is 0% is not preferable from that viewpoint.

In the composite sintered body of the present embodiment, it is preferable that an average hardness is $2 \times 10^4$ N/mm$^2$ or Kiger and an average Young's modulus is $3.5 \times 10^5$ N/mm$^2$ or higher.

It is more preferable that the average hardness is 22423 N/mm$^2$ or higher and the average Young's modulus is 383594 N/mm$^2$ or higher. Further, in the composite sintered body of the present embodiment, it is preferable that the portion where the silicate is aggregated, that is, the portion that includes the silicate, is formed of only silicate. The silicate is preferably a fine silicate, and more preferably a microcrystal. It is preferable that the average hardness of the portion where the silicate is aggregated is $2 \times 10^4$ N/mm$^2$ or higher and the average Young's modulus is $3.5 \times 10^5$ N/mm$^2$ or higher. It is more preferable that the average hardness is 22423 N/mm$^2$ or higher and the average Young's modulus is 383594 N/mm$^2$ or higher. If the hardness and Young's modulus of the portion where the silicate is aggregated are large, shedding from the silicate portion is suppressed at the time of ion impact on the electrostatic chuck during waferless dry cleaning, and thus improvement in particle can be expected. The average hardness and the average Young's modulus can be calculated by the method according to ISO14577-1.

In the composite sintered body of the first embodiment, it is preferable that both the relative dielectric constant at 200 Hz and the relative dielectric constant at 1 MHz are 10 or higher in the entire range of 24° C. or higher and 400° C. or lower and both the dielectric loss tangent at 200 Hz and the dielectric loss tangent at 1 MHz are 0.04 or lower in the entire range of 24° C. or higher and 400° C. or lower.

In the composite sintered body of the first embodiment, it is also preferable that with respect to the relative dielectric constant at 200 Hz, the difference between the maximum value and the minimum value in the range of 24° C. or higher and 400° C. or lower is 6 or lower.

In the composite sintered body of the first embodiment, it is also preferable that the volume resistance value is $1\times10^{-13}$ Ω·cm or higher in the entire range of 24° C. or higher and 400° C. or lower.

(Composite Sintered Body of Second Embodiment)

Next, the composite sintered body configuring the base (the placing plate 11 and the supporting plate 12) of the second embodiment will be described in detail.

The composite sintered body of the second embodiment is formed using, as a forming material, a composite sintered body of ceramics, which includes a metal oxide as a main phase and silicon carbide as a sub-phase.

Further, in the composite sintered body of the second embodiment, both the relative dielectric constant at 200 Hz and the relative dielectric constant at 1 MHz are 10 or higher in the entire range of 24° C. or higher and 400° C. or lower. In an electrostatic chuck device using such a composite sintered body as a base, a high attraction force can be obtained in a wide temperature range.

It is also preferable that the relative dielectric constant is 11 or higher or 12 or higher in the entire range. The upper limit value of the relative dielectric constant can be optionally selected. However, it may be, for example, 18 or lower, 16 or lower, 15 or lower, or 14 or lower.

Further, in the composite sintered body of the second embodiment, both the dielectric loss tangent at 200 Hz and the dielectric loss tangent at 1 MHz are 0.04 or lower in the entire range of 24° C. or higher and 400° C. or lower. It is also preferable that the dielectric loss tangent is 0.03 or lower. In an electrostatic chuck device using such a composite sintered body as a base, it is possible to cause a high frequency generating plasma to transmit in a wide temperature range. The lower limit of the dielectric loss tangent can be optionally selected. However, it may be, for example, 0.000 or higher or 0.001 or higher.

Further, in the composite sintered body of the second embodiment, with respect to the relative dielectric constant at 200 Hz, the difference (absolute value) between the maximum value and the minimum value in the range of 24° C. or higher and 400° C. or lower is preferably 6 or lower, more preferably 4 or lower, and further preferably 2 or lower. In an electrostatic chuck device using such a composite sintered body as a base, a stable attraction force can be obtained in a wide temperature range.

Further, in the composite sintered body of the second embodiment, it is preferable that the volume resistance value (volume resistivity) is $1\times10^{13}$ Ω·cm or higher in the entire range of 24° C. or higher and 400° C. or lower. It is also preferable that the volume resistance value is $1\times10^{15}$ Ω·cm or higher, or $1\times10^{16}$ Ω·cm or higher.

In a case where it is $1\times10^{13}$ Ω·cm or higher, excellent characteristics can be obtained.

In an electrostatic chuck device using such a composite sintered body as a base, detachment of a wafer after the end of electrostatic attraction becomes easy in a wide temperature range. Further, in an electrostatic chuck device using such a composite sintered body as a base, the electric charges accumulated on the surface of the electrostatic chuck part 2 (base) can be gradually released. In this way, creepage fracture or dielectric breakdown of the electrostatic chuck part 2 can be suppressed.

(Features of Composite Sintered Bodies of First and Second Embodiments)

In the composite sintered bodies of the first and second embodiments, the crystal grains of the silicon carbide are preferably dispersed in the crystal grains of the metal oxide and at the crystal grain boundaries of the metal oxide. In this case, the proportion of the crystal grains of the silicon carbide dispersed in the crystal grains of the metal oxide is preferably 25% or more in terms of an area ratio with respect to the crystal grains of the silicon carbide existing in the crystal grains and at the crystal grain boundaries of the metal oxide, that is, the total crystal grains of the silicon carbide. The proportion is more preferably 30% or more, and further preferably 50% or more, and may be 100%. The remaining silicon carbide crystal grains, which are not included in the crystal grains, exist at the crystal grain boundaries of the metal oxide.

In the composite sintered body, the proportion of the "crystal grains of the silicon carbide dispersed in the crystal grains of the metal oxide" to the "total crystal grains of the silicon carbide" is 25% or more in terms of an area ratio when observed with a microscope, and thus, the insulation properties can be sufficiently improved. In order to improve the insulation properties, the larger the proportion, the more preferable. A state where all the crystal grains of the silicon carbide are dispersed in the crystal grains of aluminum oxide is particularly preferable.

Due to the above proportion being 25% or more, the dielectric constant of the composite sintered body becomes high. Further, due to the above proportion being 25% or more, the dielectric loss tangent at a low frequency becomes small.

In the present invention, the "proportion of the crystal grains of the silicon carbide dispersed in the crystal grains of the metal oxide" in the composite sintered body can be calculated from a scanning electron micrograph in any field of view of the composite sintered body.

Specifically, with respect to the composite sintered body, an electron micrograph is taken at a magnification of 10000 times in a randomly selected field of view. The total area of all the silicon carbide crystal grains shown in this electron micrograph is defined as the area of the "total crystal grains of the silicon carbide". On the other hand, the area of the "crystal grains of the silicon carbide dispersed in the crystal grains of the metal oxide" in the above electron micrograph is determined. From the area determined in this way, the proportion of the "crystal grains of the silicon carbide dispersed in the crystal grains of the metal oxide" to the "total crystal grains of the silicon carbide" is obtained in terms of an area ratio.

The same processing is performed on electron micrographs in two different fields of view to obtain the respective proportions. The average value of the obtained three proportions is obtained as an area ratio indicating the "proportion of the crystal grains of the silicon carbide dispersed in the crystal grains of the metal oxide".

In the composite sintered bodies of the first and second embodiments, the average crystal grain size of the crystal grains of the silicon carbide dispersed in the crystal grains of the metal oxide can be optionally selected. However, it is preferably 0.03 μm or higher and 0.7 μm or lower. The average crystal grain size is more preferably 0.05 μm or higher and 0.3 μm or lower, and further preferably 0.1 μm or higher and 0.2 μm or lower.

The proportion of the silicon carbide in the entire composite sintered body is preferably 8% by mass or less. It is more preferably 6% by mass or less, and further preferably 3% by mass or less. The lower limit can be optionally selected. However, it may be, for example, 1.5% by mass or more.

The metal oxide that is included in the composite sintered bodies of the first and second embodiments can be optionally selected. However, aluminum oxide or yttrium oxide can be preferably used. In addition, zirconium oxide, silicon oxide, mullite, yttrium aluminum garnet, hafnium oxide, $ReAl_2O_3$ (Re is a rare earth element), or the like can also be used.

In the composite sintered bodies of the first and second embodiments, the average crystal grain size of the metal oxide can be optionally selected. However, it is preferably 1.2 μm or higher and 10 μm or lower. It is more preferably 1.5 μm or higher and 5 μm or lower, and further preferably 1.7 μm or higher and 3 μm or lower.

In the composite sintered body, the average crystal grain size of the metal oxide is 1.2 μm or higher, whereby a sufficient insulation effect can be exhibited without excessively lowering the resistivity of the particle itself of the metal oxide. Further, the average crystal grain size of the metal oxide is 10 μm or lower, whereby the mechanical strength of the obtained sintered body becomes sufficiently high, and thus damage (chipping) does not easily occur.

In the composite sintered body, the average crystal grain size of the metal oxide can be adjusted by controlling a sintering temperature. If the sintering temperature is high, the average crystal grain size of the metal oxide tends to become large, and if the sintering temperature is low, the average crystal grain size of the metal oxide tends to become small.

The composite sintered body, which is the material for forming the placing plate 11 and the supporting plate 12, has the configuration as described above, whereby both the high dielectric constant and the high volume resistivity value, that is, both the high dielectric constant and the low dielectric loss tangent can be achieved.

The metal oxide as a main phase, among the substances configuring the composite sintered bodies of the first and second embodiments, is an insulator. The silicon carbide as a sub-phase is an electric conductor. Therefore, if an electric current is tried to flow through the composite sintered body, electrons easily move in the crystal grain boundaries in which the electric conductors are disposed.

In a composite sintered body having the same composition known in the related art, that is, a composite sintered body that is obtained from a metal oxide and silicon carbide, it is known that the crystal grains of the silicon carbide, which are at the crystal grain boundaries of the metal oxide, exist 80% or more with respect to the total silicon carbides.

On the other hand, in the composite sintered bodies of the first and second embodiments, the proportion of the crystal grains of the silicon carbide dispersed in the crystal grains of the metal oxide is 25% or more in terms of an area ratio with respect to the total crystal grains of the silicon carbide included in the composite sintered body. That is, at the crystal grain boundaries of the metal oxide, the crystal grains of the silicon carbide exist in the amount of 75% or less with respect to the total crystal grains of the silicon carbide that is included in the composite sintered body.

Therefore, in the composite sintered bodies of the first and second embodiments, the amount of the electric conductors (silicon carbide) existing at the crystal grain boundaries where electrons easily move is small as compared with a composite sintered body of the related art. Therefore, electrons are difficult to move, and thus it is considered that the volume resistivity value becomes high.

Further, in the composite sintered bodies of the first and second embodiments, the amount of the silicon carbide dispersed in the crystal grains of the metal oxide is 25% or more, which is larger than that in a composite sintered body of the related art. If the proportion of the silicon carbide dispersed in the crystal grains of the metal oxide increases in this manner, the distance between the silicon carbide particles which are electric conductors becomes short in the crystal grain, and the electric capacity increases. Therefore, in the composite sintered bodies of the first and second embodiments, the dielectric constant tends to become high.

In SiC, a large number of crystal structures are known. Specifically, silicon carbide having a 3C type (zincblende type) crystal structure in a cubic system, silicon carbide having a wurtzite type crystal structure in a hexagonal system of a 4H type, a 6H type, or the like, and silicon carbide having a 15R type crystal structure in a rhombohedral system can be given as examples. Among these, the silicon carbide having a 3C type crystal structure is referred to as "β-SiC". Further, all the silicon carbides having crystal structures other than the 3C type crystal structure are referred to as "α-SiC".

In the placing plate 11 and the supporting plate 12 in the first and second embodiments, it is preferable that SiC which is included in the composite sintered body is β-sic. Further, in the composite sintered body, it is preferable that the crystal grains of β-SiC exist to be dispersed in a state of being surrounded by the crystal grains of the metal oxide which is a matrix material, that is, in the crystal grains of the metal oxide. In the composite sintered body, the volume ratio of β-sic is preferably 4% by volume or more and 15% by volume or less and more preferably 6% by volume or more and 10% by volume or less, with respect to the entire composite sintered body.

If the volume ratio of β-sic is 4% by volume or more, the expression effect of electron conductivity by SiC particles is large. Further, if the volume ratio of β-SiC is 15% by volume or less, the contact between SiC particles does not easily occur to tend to cause a decrease in resistance value through SiC particle.

Further, in the composite sintered bodies of the first and second embodiments, it is preferable that the content of metal impurities other than aluminum and silicon is 100 ppm or less. The content of metal impurities is preferably 50 ppm or less and more preferably 25 ppm or less.

[Method for Manufacturing Composite Sintered Body]

A method for manufacturing the composite sintered bodies according to the first and second embodiments includes (a) a pre-oxidation step of oxidizing the surfaces of silicon carbide particles, (b) a step of obtaining slurry that includes a dispersion medium, by injecting the silicon carbide particles treated in the pre-oxidation step and metal oxide particles to mix the silicon carbide particles and the metal oxide particles while causing the silicon carbide particles and the metal oxide particles to collide with each other, (c) a step of adjusting pH of the slurry so as to be included in a range in which the surface charges of the metal oxide particles in the slurry become positive and the surface charges of the silicon carbide particles in the slurry become negative, after a dispersant is added to the slurry, (d) a step of obtaining granules that include the metal oxide particles and the silicon carbide particles, by removing the dispersion medium from the pH-adjusted slurry, (e) a step of oxidizing the surfaces of the granules by heating the obtained granules at a temperature of 300°

C. or higher and 600° C. or lower in a non-oxidative atmosphere, and then heating the surfaces in an oxidative atmosphere, (f) a step of obtaining a formed body by forming the oxidized granules, and (g) a step of pressure-sintering the obtained formed body by heating the formed body to a temperature of 1600° C. or higher while compacting the formed body at a pressure of 25 MPa or higher, in a non-oxidative atmosphere.

The "non-oxidative atmosphere" can be optionally selected. However, as a preferred example thereof, an inert gas atmosphere or a vacuum atmosphere is included.

As an inert gas, it can be optionally selected, and for example, nitrogen and/or argon can be preferably used.

In the first and second embodiments, the "vacuum" is a "state in a space filled with a gas having pressure lower than atmospheric air pressure". The "vacuum" refers to a state defined as an industrially usable pressure in the JIS standard. In the present embodiment, the vacuum atmosphere may be low vacuum (100 Pa or higher). However, it is preferably medium vacuum (in a range of 0.1 Pa to 100 Pa) and more preferably high vacuum (in a range of $10^{-5}$ Pa to 0.1 Pa).

The "oxidative atmosphere" may mean that an atmosphere gas includes oxygen. Examples of the oxidative atmosphere include not only an atmospheric air atmosphere but also a mixed gas atmosphere of an inert gas and oxygen.

In the first and second embodiments, an example in which aluminum oxide is used as the metal oxide will be described below.

In the method for manufacturing the composite sintered bodies according to the first and second embodiments, it is preferable that an aluminum oxide particle that is used has an aluminum oxide content of 99.99% or more. Such high-purity aluminum oxide particles can be adjusted by using an alum method. In the aluminum oxide particles adjusted by using the alum method, the content of sodium atoms which are metal impurities can be significantly reduced as compared with aluminum oxide particles adjusted by using, for example, a Bayer method. Further, as long as an aluminum oxide particle having a desired purity can be obtained, various other methods can be adopted.

((a) Pre-Oxidation Step)

In the method for manufacturing the composite sintered bodies according to the first and second embodiments, first, heating treatment is performed on the silicon carbide particles, which are used as a raw material, in an oxidative atmosphere. That is, the method includes a pre-oxidation step in which oxidation treatment is performed on the surfaces of the silicon carbide particles in advance by the heating treatment. Hereinafter, there is a case where the above oxidation treatment is referred to as "pre-oxidation". The temperature and time of the pre-oxidation can be optionally selected. The temperature is, for example, preferably in a range of 250 to 600° C., and more preferably in a range of 300 to 500° C. The time of the pre-oxidation step is, for example, preferably in a range of 1 to 24 hours, and more preferably in a range of 6 to 12 hours. However, there is no limitation to these examples. For example, preheating can be preferably performed by heating at 500° C. for 12 hours. The average particle diameter of the silicon carbide particles can be optionally selected. However, it is, for example, preferably in a range of 20 to 100 nm, and more preferably in a range of 35 to 80 nm. However, there is no limitation to these examples. The average particle diameter may be the length average diameter of the particle.

By pre-oxidizing the silicon carbide particles, a film of silicon oxide ($SiO_2$) is formed on the surface of the silicon carbide particle. As a result, the hydrophilicity of the silicon carbide particle is increased. In this way, dispersibility of the silicon carbide particles in the slurry is improved.

((b) Step of Obtaining Slurry)

In the step of performing mixing in order to obtain the slurry, a pulverizing and mixing device, for example, a two-stream particle collision type pulverizing and mixing device, is used. A dispersion medium is prepared, and the aluminum oxide particles and the pre-oxidized silicon carbide particles are dispersed therein. The aluminum oxide particles and the silicon carbide particles are mixed by injecting the dispersion liquid at high speed by pressurizing it while causing the aluminum oxide particles and the silicon carbide particles to collide with each other, by using the above device. By this mixing, the aluminum oxide particles and the silicon carbide particles are pulverized, and a dispersion liquid (slurry) that includes the pulverized particles of these particles is obtained. The injection speed can be optionally selected. However, it is preferable that it is in a range of 300 ml/min to 550 ml/min, for example.

The average particle diameter of the metal oxide particles such as that of aluminum oxide that is used as a raw material can be optionally selected. However, it is preferably in a range of 0.05 to 0.3 μm, and more preferably in a range of 0.1 to 0.25 μm, for example.

The proportion of the silicon carbide particles to the total of the metal oxide particles and the silicon carbide particles is preferably in a range of 3 to 15% by mass, and more preferably in a range of 5 to 10% by mass. However, there is no limitation to these examples.

The proportion of the total amount of metal oxide particles and silicon carbide particles in the slurry can be optionally selected, and may be in a range of 3 to 15% by mass, or 5 to 10% by mass, for example.

The dispersion medium can be optionally selected, and for example, water and alcohols such as methanol and ethanol can be used. Only one kind of these dispersion media may be used, or two or more kinds may be used in combination.

When causing the aluminum oxide particles and the silicon carbide particles to collide with each other, large particles have large kinetic energy at the time of collision and are easily pulverized. On the other hand, small particles have small kinetic energy at the time of collision and are difficult to be pulverized. Therefore, the pulverized aluminum oxide particles and silicon carbide particles, which are obtained by using the above pulverizing and mixing device, become particles having a narrow particle size distribution width with few coarse particles or over-pulverized particles. Therefore, if the mixed particles pulverized and mixed by using the two-stream particle collision type pulverizing and mixing device are used, it is possible to suppress abnormal grain growth with coarse particles as nuclei, in the sintering step.

Further, in a case of performing the pulverizing and mixing using such a pulverizing and mixing device, it is possible to suppress mixed-in of impurities due to the breakage of each medium, as compared with a method of pulverizing and mixing using a medium such as a ball mill or a bead mill, for example.

((c) Step of Adjusting pH)

In the step of adjusting pH, the pH adjustment of the slurry is performed in consideration of the surface charges of the aluminum oxide particles and the silicon carbide particles in the slurry. The slurry (slurry before pH adjustment) which is obtained in the mixing step usually exhibits basicity of about pH 11.

Figure 2:
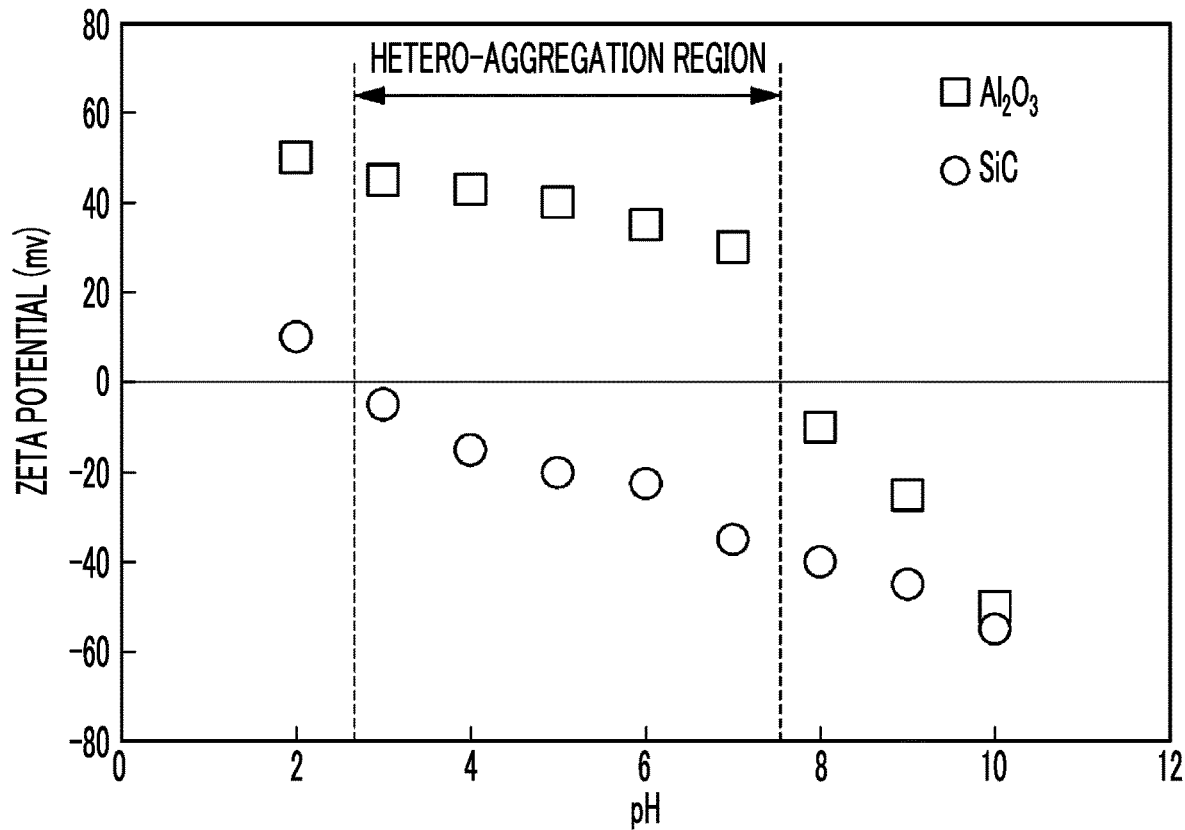
FIG. 2 is a graph showing a relationship between slurry pH and a zeta potential of each particle, which explains aluminum oxide particles and silicon carbide particles in slurry.

FIG. 2 is a graph showing the relationship between the pH of a system and a zeta potential of each particle. In the drawing, the horizontal axis represents the pH of a system, and the vertical axis represents the zeta potential (unit: mV) of each particle. The aluminum oxide particles and the silicon carbide particles in the drawing were evaluated separately.

As shown in FIG. 2, in a case where the pH of the system is on the acidic side (pH<7), the zeta potential of the metal oxide particles such as aluminum oxide particles becomes positive. This is because, in a case where the pH of the system is on the acidic side, hydroxyl groups on the surfaces of the metal oxide particles are protonated ($H^+$) and the surfaces are positively charged.

On the other hand, in a case where the pH of the system is on the basic side (pH>7), the zeta potential of the metal oxide particles such as aluminum oxide particles becomes negative. This is because, in a case where the pH of the system is on the basic side, protons are dissociated from the hydroxyl groups on the surfaces of the metal oxide particles and the surfaces are negatively charged.

In contrast, the behavior of the zeta potential of the silicon carbide particles is different. As shown in the drawing, in the silicon carbide particles, the zeta potential becomes 0 in the vicinity of pH in a range of 2 to 3, and the zeta potential becomes negative in a wide range from an acidic region in the vicinity of pH 3 to a basic region.

In a case where two particles having such a relationship coexist in the same slurry, in the range of the pH of the system in which the "surface charges of the aluminum oxide particles in the slurry becomes positive" and the "surface charges of the silicon carbide particles in the slurry becomes negative", so-called hetero-aggregation in which both particles are aggregated occurs. In FIG. 2, the range in which the pH of the system falls within the above range is a pH range of about 2.6 to 7.5.

It is preferable to appropriately add a dispersant to the slurry such that the aluminum oxide particles and the silicon carbide particles do not precipitate. As the dispersant, a known dispersant, for example, a polycarboxylic acid-based dispersant can be used. A commercially available product can be preferably used as the dispersant, and for example, Aron A6114 (manufactured by Toagosei Co., Ltd.) can be used.

The pH of the system is preferably 3 or higher and 7 or lower, more preferable 5 or higher and 7 or lower, and further preferable 6 or higher and 7 or lower. In a case where the zeta potentials of both particles after the pH adjustment are compared with each other, the closer to each other the absolute values of the zeta potentials are, the more easily the hetero-aggregation occurs, and thus a desired aggregation state is obtained.

The pH adjustment can be performed by adding an acid to the slurry. As usable acids, inorganic acids such as nitric acid, phosphoric acid, hydrochloric acid, and sulfuric acid, and an organic acid such as acetic acid can be preferably given as examples. Among these, hydrochloric acid, sulfuric acid, or the like generates chlorine or sulfur in an apparatus in the sintering step to be described later, and thus there is a possibility that it may cause deterioration of the apparatus. Therefore, it is preferable to use nitric acid, phosphoric acid, an organic acid, or the like for the pH adjustment.

((d) Step of Obtaining Granules)

In the step of obtaining granules, the dispersion medium is removed from the pH-adjusted slurry to obtain granules that include the aluminum oxide particles and the silicon carbide particles. The method for removing the dispersion medium can be optionally selected, and for example, a known spray-drying method can be suitably used. The size of the granule can be optionally selected. However, in general, it may be, for example, in a range of 30 to 100 μm, 50 to 85 μm, or the like.

In the spray-drying method, fine droplets of the slurry are sprayed to increase the surface area per unit volume of the slurry, and hot air is continuously brought into contact with the fine droplets, thereby being able to instantaneously perform drying and granulation. The granules granulated by the spray-drying method tend to have a spherical shape reflecting the shape of the fine droplet.

((e) Oxidation Treatment Step)

In the oxidation treatment step, the treatment is sequentially performed in two atmospheres.

First, the obtained granules are heated to a temperature of 300° C. or higher and 600° C. or lower (for example, 500° C.) under normal pressure (without pressing) in a non-oxidative atmosphere to remove contaminants such as moisture, the dispersion medium, the dispersant, and the like included in the granule. The temperature may be in a range of 300 to 400° C., 400 to 500° C., or 500 to 600° C., as necessary. The heating time can be optionally selected. However, it may be, for example, in a range of 3 to 8 hours, 8 to 10 hours, or 10 to 15 hours.

As the non-oxidative atmosphere, an inert gas atmosphere using nitrogen or argon is preferable. Further, in a case where the heating is performed in an inert gas atmosphere, the heating treatment by a so-called gas flow, in which an atmosphere gas is cause to flow, is preferable in order to efficiently discharge the generated contaminants to the outside of the system.

Next, the granules from which the contaminants have been removed are oxidized by heating the granules at an optionally selected temperature, for example, 400° C., in an oxidative atmosphere. The oxidization treatment atmosphere can be optionally selected. However, an atmospheric air atmosphere is preferable. The temperature can be selected as necessary, and may be in a range of 250 to 370° C., 300 to 500° C., 400 to 600° C., or the like. The heating time can be optionally selected. However, it may be, for example, in a range of 1 to 5 hours, 5 to 12 hours, or 12 to 24 hours.

According to such an operation, an oxide film is formed on each of the surfaces of the silicon carbide particles included in the granules in the oxidation treatment. Metal impurities included in the granules are easily dissolved in the oxide film. Therefore, the metal impurities included in the granules unevenly exist on each of the surfaces of the particles. In that case, because the metal impurities can be easily removed in the pressure-sintering step to be described later, it is preferable.

Further, if the oxidation treatment is performed on the granules, for example, the surfaces of the silicon carbide particles configuring the granules are easily oxidized as compared with a case where the oxidation treatment is performed on a formed body after forming the granules. Therefore, as a result of the oxidation treatment, an oxide film is easily formed on each of the surfaces of the silicon carbide particles without unevenness, which is preferable.

((f) Step of Obtaining Formed Body)

Subsequently, the obtained granules are formed, preferably uniaxially formed (uniaxially press-formed), according to the shape of a target sintered body, to obtain a formed body.

((g) Pressure-Sintering Step)

In the pressure-calcination step, it is preferable to perform preliminary heating first. First, the formed body described above is heated (preliminarily heated) to a temperature lower than 1600° C. and at normal pressure (without applying a press pressure) in a vacuum atmosphere. According to such an operation, by appropriately setting the temperature at the time of the preliminary heating, metal impurities such as alkali metal, which are included in the granules, evaporate, and thus the metal impurities can be easily removed. Therefore, according to such an operation, the purity of the granule is easily improved, and the volume resistance value (volume resistivity) of the obtained composite sintered body is easily controlled. The temperature can be selected as necessary, and may be in a range of 800 to 1000° C., 1000 to 1500° C., or the like. The heating time can be optionally selected, and may be, for example, in a range of 1 to 5 hours, 3 to 8 hours, or 6 to 12 hours.

Further, if in the forming step, the treatment is performed on the formed body from which contaminants have been removed as described above, the oxide film formed on the particle surface is volatilized by performing the preliminary heating under a vacuum atmosphere. At the same time, the metal impurities included in the oxide film evaporate. For this reason, the metal impurities can be easily removed from the formed body. Therefore, according to such an operation, the purity of the granule is easily improved, and the volume resistance value of the obtained composite sintered body is easily controlled.

In the method for manufacturing the composite sintered bodies of the first and second embodiments, it is preferable that after the preliminary heating at 1200° C. for 4 hours or more is performed, for example, in a vacuum atmosphere, air pressure is returned to atmospheric air pressure by using an inert gas, for example, argon.

Subsequently, the formed body subjected to the preliminary heating is pressure-sintered by being heated to 1600° C. or higher while being compacted at a pressure of 5 MPa or higher, in a non-oxidative atmosphere, for example, an argon atmosphere. According to such an operation, the sintering of the aluminum oxide particles and the silicon carbide particles included in the formed body proceeds, and thus a dense sintered body having few pores can be obtained. The temperature can be selected as necessary, and may be in a range of 1700 to 1800° C., 1800 to 1900° C., or the like. The heating time can be optionally selected, and may be, for example, in a range of 1 to 5 hours, 3 to 8 hours, or 6 to 12 hours.

In the method for manufacturing the composite sintered bodies of the first and second embodiments, it is preferable to perform the pressure-sintering at a temperature of 1600° C. or higher and 1850° C. or lower and a sintering pressure in a range of 25 MPa or higher and 50 MPa or lower in an argon atmosphere, for example.

In the sintered body obtained by being manufactured by such a method, the content of metal impurities is reduced, and thus the sintered body having high purity is obtained. In a case where the content of metal impurities does not reach a target value, it is favorable if the preliminary heating time is lengthened or the preliminary heating temperature is increased.

Hereinafter, the method for manufacturing the composite sintered body described above will be further described with reference to the drawings. FIGS. 3 to 9 are schematic explanatory diagrams explaining the method for manufacturing the composite sintered bodies of the first and second embodiments.

Figure 3:
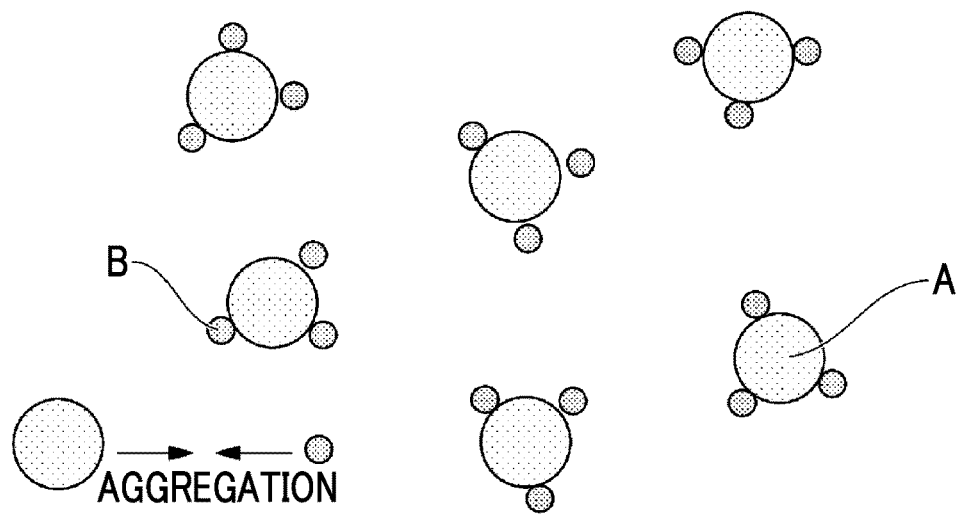
FIG. 3 is a schematic explanatory diagram explaining a method for manufacturing composite sintered bodies of the first and second embodiments.
Figure 4:
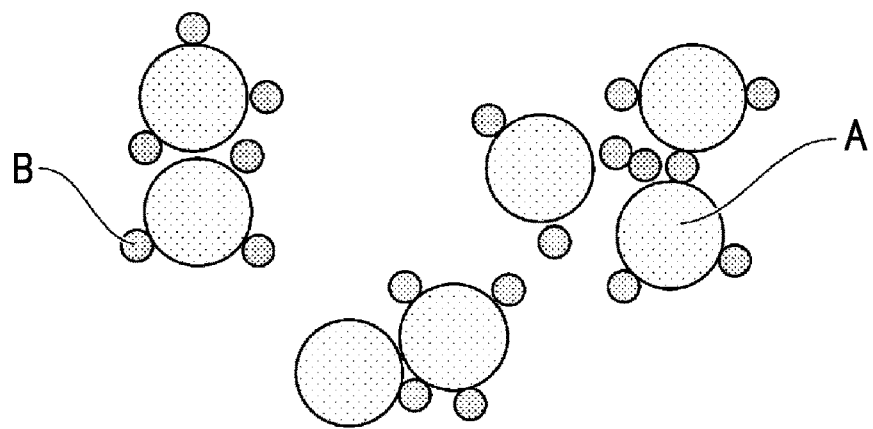
FIG. 4 is a schematic explanatory diagram explaining the method for manufacturing the composite sintered bodies of the first and second embodiments.

FIG. 3 is a schematic diagram showing the state of each particle in slurry having pH of about 6.5 and including, for example, aluminum oxide particles and silicon carbide particles. In FIG. 3, reference sign A indicates an aluminum oxide particle, and reference sign B indicates a silicon carbide particle. FIG. 4 is a schematic diagram showing the state of the particles when the dispersion medium is removed from the slurry shown in FIG. 3.

Figure 5:
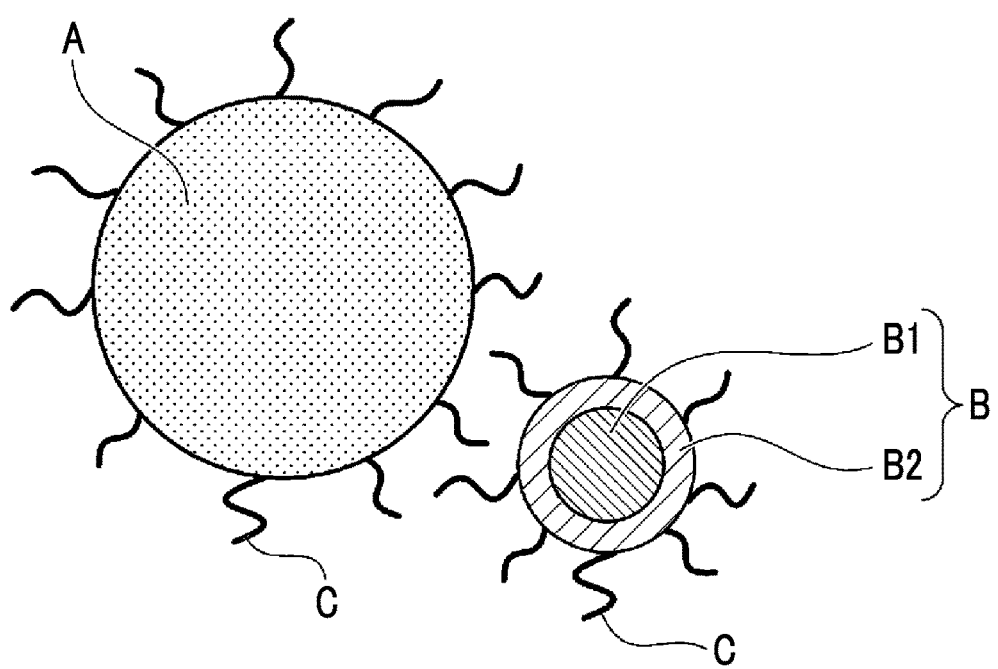
FIG. 5 is a schematic explanatory diagram explaining the method for manufacturing the composite sintered body of the first embodiment.
Figure 6:
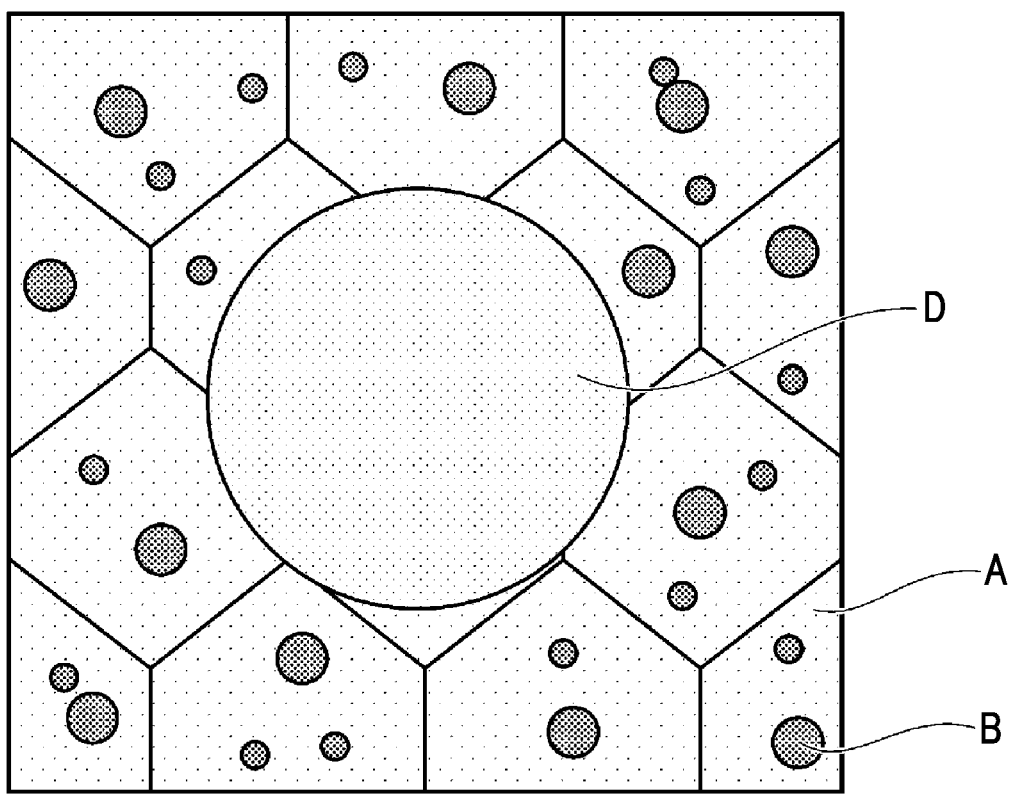
FIG. 6 is a schematic explanatory diagram explaining the method for manufacturing the composite sintered body of the first embodiment.
Figure 7:
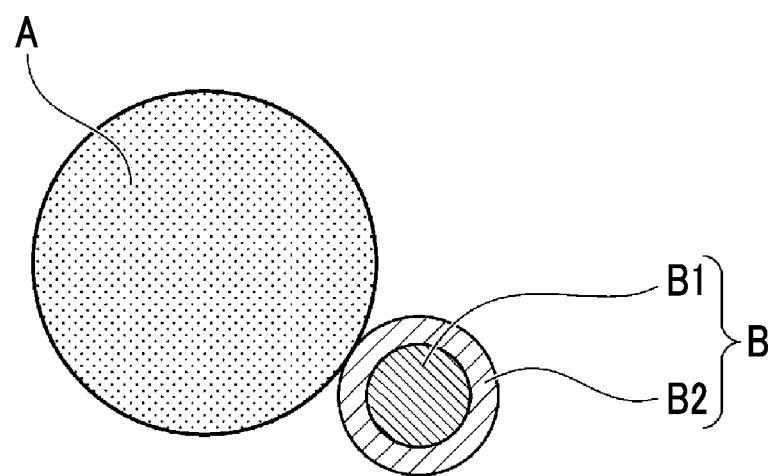
FIG. 7 is a schematic explanatory diagram explaining the method for manufacturing the composite sintered bodies of the first and second embodiments.
Figure 8:
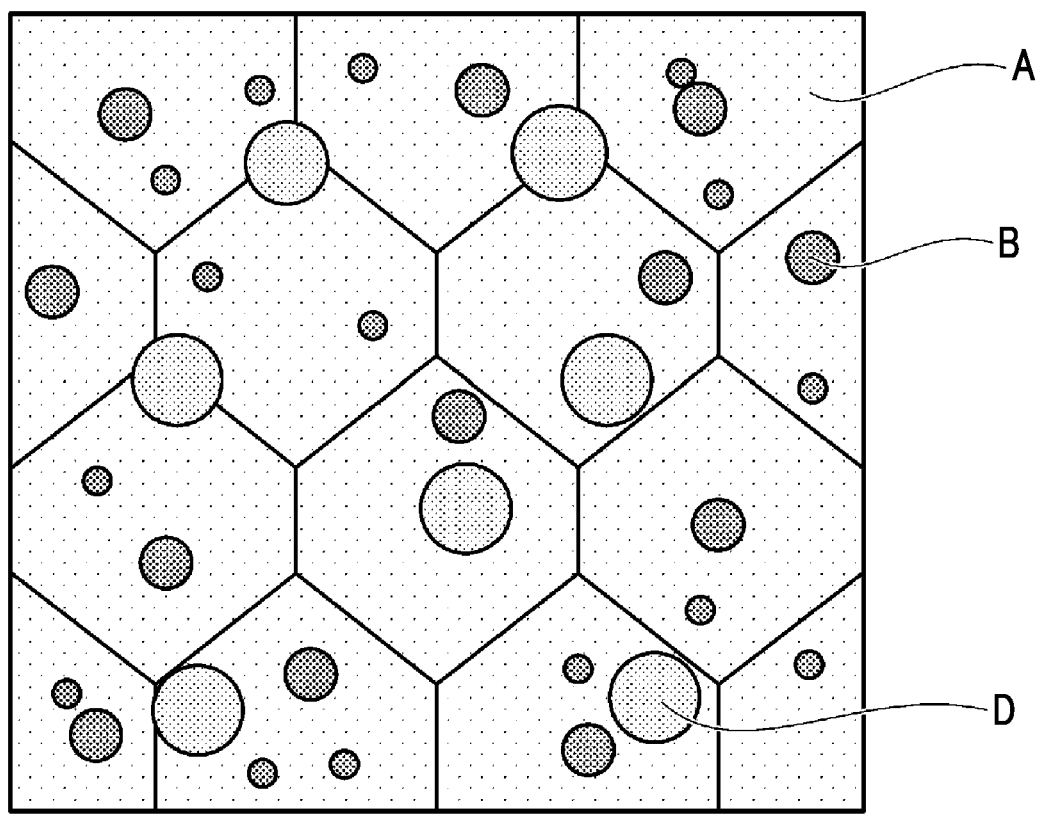
FIG. 8 is a schematic explanatory diagram explaining the method for manufacturing the composite sintered body of the first embodiment.

FIGS. 6, 8, and 11 are schematic diagrams showing composite sintered bodies made by using the particles shown in FIGS. 4, 5, and 7, or the like. In FIGS. 6, 8, and 11, a hexagonal portion represents the crystal grain of the aluminum oxide as a main phase. A black circle represents the crystal grain of the silicon carbide as a sub-phase. A gray circle represents an agglomerate of silicate.

As shown in FIG. 2 described above, in the slurry having pH of about 6.5, the surfaces of the aluminum oxide particles are positively charged (zeta potential is positive), and the surfaces of the silicon carbide particles are negatively charged (zeta potential is negative). Therefore, in the slurry system having the above pH, so-called hetero-aggregation occurs in which the aluminum oxide particles and the silicon carbide particles, which are different types of particles, are aggregated. As a result, the silicon carbide particles, which are relatively small particles, adhere to the surfaces of the aluminum oxide particles, which are relatively large particles.

In the method for manufacturing the composite sintered bodies of the first and second embodiments, as a result of adjusting the pH of the slurry to about 6.5, if the zeta potential of the silicon carbide particles decreases, the possibility that aggregation (homo-aggregation) may occur between the silicon carbide particles also increases.

As described above, in a case where the silicon carbide particles to be used are pre-oxidized, the dispersibility of the silicon carbide particles is improved. Therefore, in a case where the silicon carbide particles subjected to the pre-oxidation treatment are used, the homo-aggregation of the silicon carbide particles can be suppressed and the hetero-aggregation can proceed dominantly. In this way, a desired aggregation state (hetero-aggregation) is easily obtained.

As shown in FIG. 4, when the dispersion medium is removed in the (d) step of obtaining granules, aluminum oxide having silicon carbide already adhered to the surface aggregates. In this way, a situation is created in which heterogeneous particles are easily mixed uniformly. As a result, in the (g) pressure-sintering step, the aluminum oxide particles are easily sintered while taking in the silicon carbide particles.

Further, in the method for manufacturing the composite sintered body of the present embodiment, the granules obtained in the (d) step of obtaining granules are heated to a temperature of 300° C. or higher and 600° C. or lower in a non-oxidative atmosphere in the (e) step, and then the surfaces of the granules are oxidized. In this way, the dispersants covering the surfaces of the metal oxide particles and the surfaces of the silicon carbide particles included in the granules are removed, and the surfaces of the silicon carbide particles are oxidized. Further, by this step, the surfaces of the silicon carbide particles are oxidized without unevenness, and thus a homogeneous composite sintered body is easily obtained. Therefore, the electrical characteristics of the obtained composite sintered body are less dependent on a temperature, and stable physical properties can be easily obtained in a wide temperature range.

In FIG. 5, the silicon carbide particle B is shown as a core-shell structure composed of a core B1 made of silicon carbide and a shell B2 made of silicon oxide. As shown in FIG. 5, in a case where sintering is performed in the (g) pressure-sintering step while the surface of the aluminum oxide particle A and the surface of the silicon carbide particle B are covered with a dispersant C, the dispersant C on the surface of each particle inhibits the contact between the aluminum oxide particle A and the shell B2. Therefore, in a temperature raising process for sintering, after the dispersant C is first removed, the contact between the aluminum oxide particle A and the shell B2, that is, the sintering between the aluminum oxide particle A and the shell B2 occurs first.

In such a reaction, after the dispersant is first removed, the aluminum oxide particle A and the shell B2 come into direct contact with each other to start the reaction, and by that time, it is considered that the temperature becomes relatively high as compared with the manufacturing method of the present embodiment in which the dispersant C is removed in advance. Therefore, it is considered that the generated silicate is relatively easy to grain-grow.

As a result, as shown in FIG. 6, it is considered that the generated silicate is easy to grain-grow and is easily coarsened. In a case where such a composite sintered body is exposed to plasma, the coarsened silicate C is easily eroded. As a result, local damage occurs and the life is shortened.

As shown in FIG. 7, in the granules obtained in the (e) oxidation treatment step of the present embodiment, the dispersant C has already been removed from the particle surface. In the formed body that is obtained using such granules in the (f) step of obtaining a formed body, the aluminum oxide particle A and the shell B2 made of silicon oxide of the silicon carbide particle B come into good contact with each other.

Therefore, in the (g) pressure-sintering step that is subsequently performed, in a case where the formed body is heated to a temperature set as a sintering temperature at a predetermined temperature rise rate, the reaction between the aluminum oxide particle A and the shell B2 (SiO$_2$ film) on the surface of the silicon carbide particle B is started as soon as a sinterable temperature is reached. In such a reaction, the metal oxide particle and the shell B2 (SiO$_2$ film) start the reaction under a relatively low temperature condition.

As a result, as shown in FIG. 8, in the obtained composite sintered body, it is considered that the generated silicate is difficult to grain-grow and fine silicate is easily generated. In FIG. 6, the agglomerate of silicate is indicated by reference sign D. In a case where such a composite sintered body is exposed to plasma, it is eroded from the silicate D. However, since the silicate D becomes fine and is dispersed, large local damage does not occur and the life can be extended.

In the composite sintered body, aluminum oxide grows while incorporating many crystal grains of silicon carbide into the crystal. Therefore, the abundance of the crystal grain of the silicon carbide B at the crystal grain boundary of the aluminum oxide A becomes small. Further, in the composite sintered body of the present embodiment, even in the crystal grain of the aluminum oxide, the crystal grain of the silicon carbide easily becomes small and the number of particles is easily increased.

By the above, the composite sintered body of the present embodiment can be manufactured.

The obtained composite sintered body can be ground in a subsequent step to form a desired base. The protrusions formed on the placing surface of the base can be appropriately formed by a known method.

According to the composite sintered body as described above, it is possible to achieve both the high dielectric constant and the low dielectric loss tangent in a wide temperature range.

Further, according to the electrostatic chuck part and the electrostatic chuck device using such a composite sintered body, they can be suitably used in a low frequency region.

Further, according to the method for manufacturing a composite sintered body as described above, the composite sintered body described above can be easily manufactured.

Further, according to the electrostatic chuck part and the electrostatic chuck device as described above, they have high performance with a high wafer attraction force and a high withstand voltage.

Although preferred embodiment examples of the present invention have been described above with reference to the accompanying drawings, it goes without saying that the present invention is not limited to such examples. The various shapes, combinations, or the like of the constituent members shown in the examples described above are examples, and can be variously changed based on design requirements or the like within a scope that does not deviate from the gist of the present invention.

EXAMPLE

Hereinafter, the present invention will be described with an example. However, the present invention is not limited to the example.

A method used in evaluation will be described below.

(Measurement of Average Crystal Grain Size of Crystal Grains of Metal Oxide)

The surface of a composite oxide (sintered body) was mirror-polished with diamond paste in which the average grain size of an abrasive grain is 3 μm (particle size indication: #8000). Thereafter, thermal etching was performed at 1400° C. for 30 minutes in an argon atmosphere.

The structure of the surface of the obtained sintered body was observed at a magnification of 10000 times by using a scanning electron microscope (model number: S-4000, manufactured by Hitachi High-Technology Co., Ltd.).

The obtained electron micrograph was incorporated into image analysis type particle size distribution measurement software (Mac-View Version4, manufactured by Mountech Co., Ltd.), and the major axis diameters of 200 or higher metal oxide crystal grains were calculated. The arithmetic mean value of the major axis diameters of the obtained crystal grains was defined as the "average crystal grain size" to be obtained.

(Proportion of Crystal Grains of Silicon Carbide dispersed in Crystal Grains of Metal Oxide)

The electron micrograph obtained in the measurement of the average crystal grain size of the crystal grains of the metal oxide described above was incorporated into image analysis type particle size distribution measurement software (Mac-View Version4, manufactured by Mountech Co., Ltd.), and the area of 200 or more silicon carbide particles was calculated. Whether or not each silicon carbide particle exists in the crystal grain of the metal oxide is determined from the electron micrograph, and the proportion of the crystal grains of the silicon carbide dispersed in the crystal grains of the metal oxide to the total silicon carbide particles on which the area was determined was determined.

(Measurement of Average Aggregation Diameter of Silicate)

The surface of a composite oxide (sintered body) was mirror-polished with diamond paste in which the average grain size of an abrasive grain is 3 μm (particle size indication: #8000). Subsequently, with respect to the surface of the sintered body that has been mirror-polished, an electron image was taken using an electron beam probe microanalyzer (model number JXA-8530F, manufactured by JEOL Ltd.). The magnification at the time of the imaging was 1000 times, and the imaging range was a rectangle with the area of 600 μm².

The obtained electron micrograph was incorporated into image analysis type particle size distribution measurement software (Mac-View Version4, manufactured by Mountech Co., Ltd.), and the aggregation diameter of the silicate was calculated.

The above measurement was performed on any five locations of the composite sintered body, and from the aggregation diameters of the silicate obtained at the respective locations, the arithmetic mean value of them was obtained and defined as the "average aggregation diameter" of the silicate.

(Area Ratio of Silicate)

The electron micrograph obtained as described above was incorporated into image analysis type particle size distribution measurement software (Mac-View Version4, manufactured by Mountech Co., Ltd.). Then, the ratio of the area of the region occupied by the silicate to the total area of the regions occupied by the metal oxide and the silicon carbide was calculated.

(Average Hardness and Average Young's Modulus)

The average hardness and the average Young's modulus were calculated by the method according to ISO14577-1.

The surface of the composite sintered body was polished so as to have Ra of 0.02 μm. Thereafter, with respect to the surface, the indentation hardness and Young's modulus were measured with a test load of 100 mN by using a microhardness meter (ENT-2100, manufactured by Elionix Inc.). The measurement was performed five times, and the arithmetic mean value of the obtained measured values was taken as the "average hardness" and "average Young's modulus" to be obtained, respectively.

(Plasma Resistance)

A plate-shaped body having a size of 20 mm×20 mm×2 mm was cut out from the composite oxide manufactured by a method to be described later, one surface was mirror-polished, and a test piece having the obtained mirror surface as a test surface was fabricated. With respect to the obtained test piece, the mass thereof was measured after cleaning with acetone. Further, the surface roughness of the test surface was measured under the following measurement conditions.

(Measurement Conditions)

Surface roughness evaluation device: Dimension Icon manufactured by Bruker

Measurement range: 80 μm×80 μm

Scan Rate: 0.2 Hz

Resolution: 256×256

Subsequently, the test piece was installed in a chamber of a plasma etching apparatus. $SF_6$ gas (10 sccm/min), Ar (80 sccm/min), $O_2$ (10 sccm/min), and microwaves (100 W) were introduced into the chamber to generate $SF_6$ plasma, and the test surface of each test piece was exposed to the $SF_6$ plasma. The plasma exposure time was 3 hours, and the atmosphere pressure during the exposure was 20 mTorr. 1 Torr is equal to 133.322 Pa.

After the plasma exposure test, the surface roughness of the test surface was measured under the measurement conditions described above. Plasma resistance was evaluated from a change in surface roughness before and after the plasma exposure. It can be evaluated that the smaller the change in surface roughness before and after the plasma exposure, the higher the plasma resistance.

(Volume Resistivity Value)

In this example, the volume resistivity value of a disk-shaped sintered body was measured by a direct-current three-terminal method.

(Used Equipment)

Screen printer: MODEL MEC-2400 type, manufactured by Mitani Micronics Co., Ltd.

Resistivity measuring device: manufactured by NISHIYAMA-SEISAKUSHO Co., Ltd.

Insulation meter: digital insulation meter (Model DSM-8103, HIOKI E.E. Corporation)

(Measurement Conditions)

Measurement temperature: room temperature (24° C.), 50° C., 100° C., 150° C., 200° C., 250° C., and 300° C.

Measurement atmosphere: atmospheric air (flow rate: 200 ml/min)

Applied voltage: 1 kV (Measurement Method)

Figure 12:
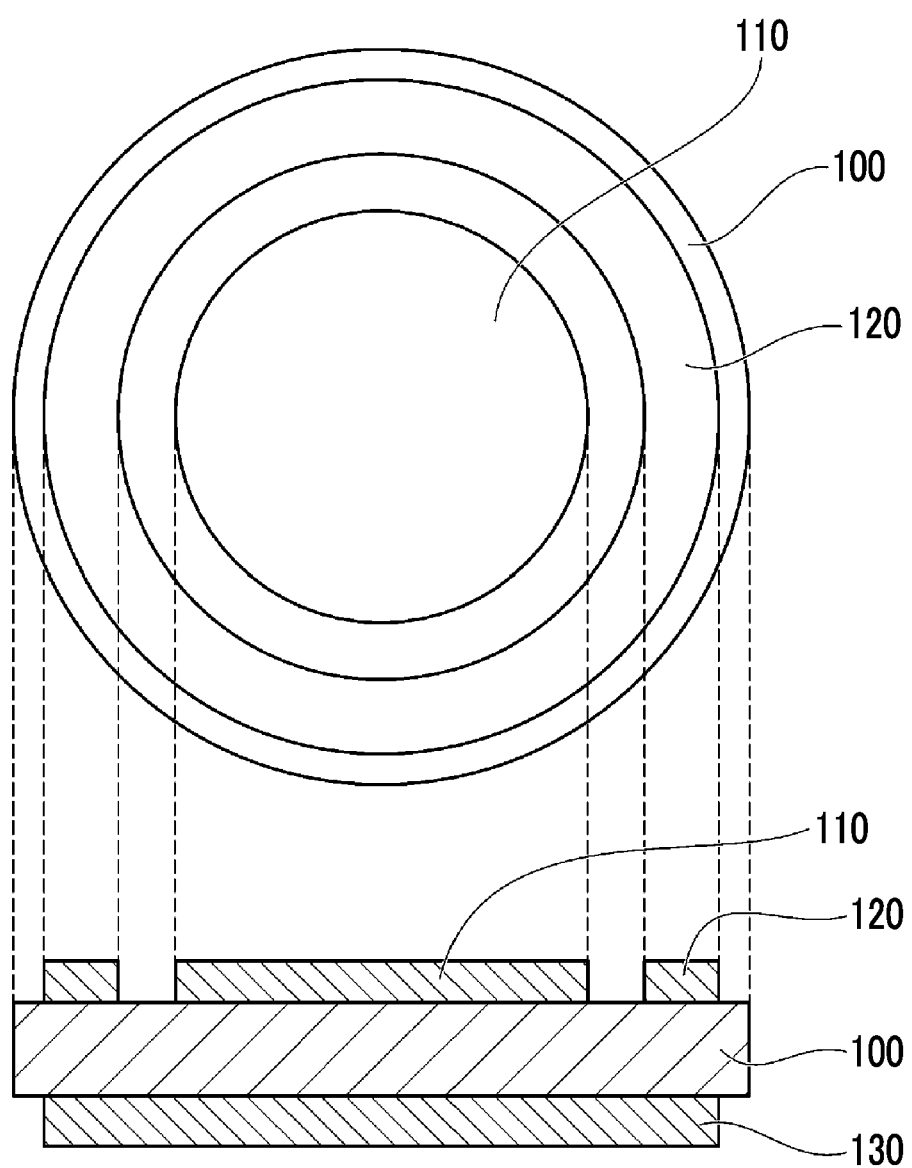
FIG. 12 is a schematic diagram showing a state of a sintered body when measuring a volume resistivity value in an example.

Silver paste (NP-4635, manufactured by Noritake Co., Ltd.) was printed on the upper and lower surfaces of the sintered body by using a screen printer, and dried at 100° C. for 12 hours in atmospheric air, and thereafter, baking was performed on the sintered body at 450° C. for 1 hour in atmospheric air, and a main electrode, a guard electrode, and a counter electrode were formed. FIG. 12 is a schematic diagram showing the state of the sintered body when measuring the volume resistivity value in this example. In the drawing, reference numeral 100 denotes the sintered body, reference numeral 110 denotes the main electrode, reference numeral 120 denotes the guard electrode, and reference numeral 130 denotes the counter electrode.

At this time, the diameter of the main electrode was 1.47 cm, and the inner diameter of the guard electrode was 1.60 cm.

A direct-current voltage was applied to the sintered body with the electrodes formed thereon as described above, at each measurement temperature, and an electric current after charging for 1 minute was measured to obtain the volume resistance of the sintered body. Thereafter, a volume resistivity value (ρv) was calculated from the following expression (1) by using the thickness of the sintered body and the area of the electrode.

$$\rho v = S/t \times Rv = S/t \times V/I \quad (1)$$

(S: effective area (cm²) of an electrode, t: thickness (cm) of a sintered body, Rv: volume resistance, V: direct-current voltage (V), I: electric current (A))

(Relative Dielectric Constant and Dielectric Loss Tangent)

In this example, the relative dielectric constant and the dielectric loss tangent were measured by a parallel plate method.

(Used Equipment)

Used equipment: Impedance analyzer, model number E4990A, manufactured by Keysight Technology Co., Ltd. (measurement range: from 100 kHz to 1 MHz)

LCR meter, model number 4274A, manufactured by Keysight Technology Co., Ltd. (measurement range: from 100 Hz to 100 kHz)
(Measurement Conditions)
Measurement atmosphere: atmospheric air
Measurement temperature: 25° C., 100° C., 150° C., 200° C., 300° C., and 400° C.

Example 1

As a starting material, β-sic type silicon carbide (β-sic)$_p$ articles having an average particle diameter of 0.03 µm and synthesized by thermal plasma CVD, and aluminum oxide ($Al_2O_3$) particles having an average particle diameter of 0.1 µm and a metal impurity content of 95 ppm were used.

With respect to the β-SiC particles, the particle surface was oxidized by performing heating treatment at 500° C. for 12 hours under an atmospheric air atmosphere. This operation corresponds to the "pre-oxidation step" in the present invention.

In the following steps, β-sic subjected to the pre-oxidation treatment was used.

The β-SiC particles and the $Al_2O_3$ particles were weighed such that the β-SiC particles are 7% by mass with respect to the total amount of the β-sic particles and the $Al_2O_3$ particles, and the β-sic particles and the $Al_2O_3$ particles were introduced into distilled water that includes a polycarboxylic acid-based dispersant. The dispersion liquid with the β-sic particles and the $Al_2O_3$ particles introduced therein was subjected to dispersion treatment by an ultrasonic dispersing device. Thereafter, pulverizing and mixing were performed using a two-stream particle collision type pulverizing and mixing device. This operation corresponds to the "step of obtaining slurry" in the present invention.

With respect to the obtained mixed solution, nitric acid was added to the slurry to adjust pH of the slurry to 6.5.

This operation corresponds to the "step of adjusting pH" in the present invention.

The pH-adjusted slurry was spray-dried by a spray dryer to obtain granules which includes β-sic and $Al_2O_3$.

This operation corresponds to the "step of obtaining granules" in the present invention.

Subsequently, the granules were heated to 370° C. under a nitrogen atmosphere to remove moisture and the dispersant (contaminants). Thereafter, the granules were heated at 300° C. for 12 hours in an atmospheric air atmosphere.

This operation corresponds to the "oxidation treatment step" in the present invention.

Subsequently, the granules were subjected to uniaxial press forming at a press pressure of 8 MPa to obtain a formed body having a diameter of 320 mm and a thickness of 15 mm.

This operation corresponds to the "forming step" in the present invention.

The obtained formed body was set in a graphite mold and pressure-sintering was performed. First, the formed body was heated to 1200° C. under a vacuum atmosphere without applying a press pressure thereto. Thereafter, sintering was performed at a press pressure of 40 MPa and a temperature of 1800° C. under an argon atmosphere to obtain a composite sintered body of Example 1.

This operation corresponds to the "pressure-sintering step" in the present invention.

Further, with respect to the composite sintered body of Example 1, an electron micrograph was taken under the conditions described above. When the average crystal grain size of $Al_2O_3$ was determined from the obtained electron micrograph, the average crystal grain size was 1.61 µm. Further, when the average crystal grain size of SiC was determined, the average crystal grain size was 0.18 µm.

The proportion of the crystal grains of SiC dispersed in the crystal grains of $Al_2O_3$ was 50%.

Comparative Example 1

Instead of heating granules at 300° C. for 12 hours in an atmospheric air atmosphere, a formed body obtained by uniaxially press-forming granules was heated at 300° C. for 12 hours in an atmospheric air atmosphere and then set in a graphite mold, and pressure-sintering was performed. A composite sintered body of Comparative Example 1 was obtained in the same manner as in Example 1 except for this.

With respect to the composite sintered body of Comparative Example 1, an electron micrograph was taken under the conditions described above. When the average crystal grain size of $Al_2O_3$ was determined from the obtained electron micrograph, the average crystal grain size was 0.94 µm. Further, when the average crystal grain size of SiC was determined, the average crystal grain size was 0.26 µm.

The proportion of the crystal grains of SiC dispersed in the crystal grains of $Al_2O_3$ was 18%.

Figure 9:
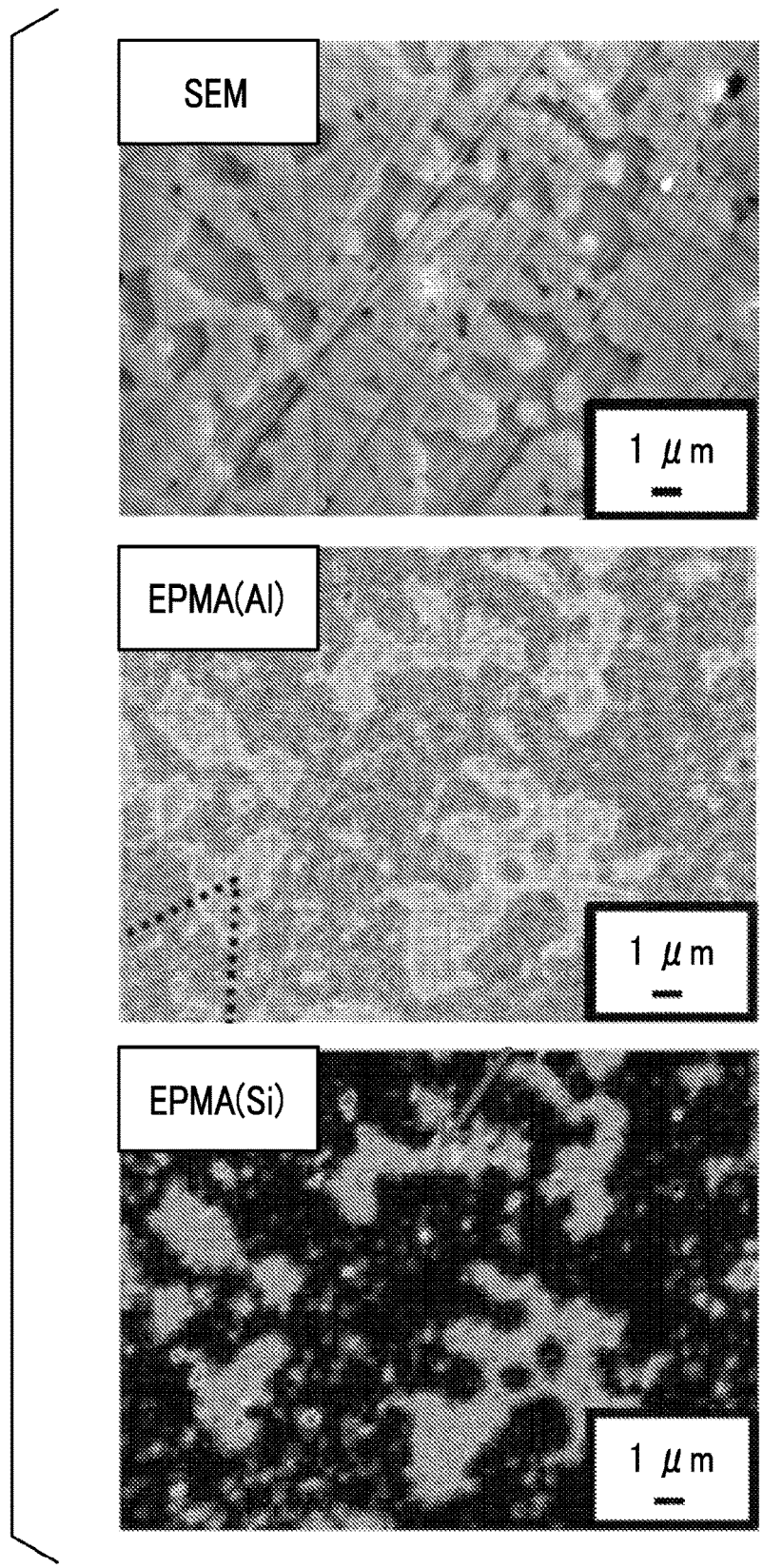
FIG. 9 is an SEM image and an EPMA image in the same field of view, of a composite sintered body of Example 1.
Figure 10:
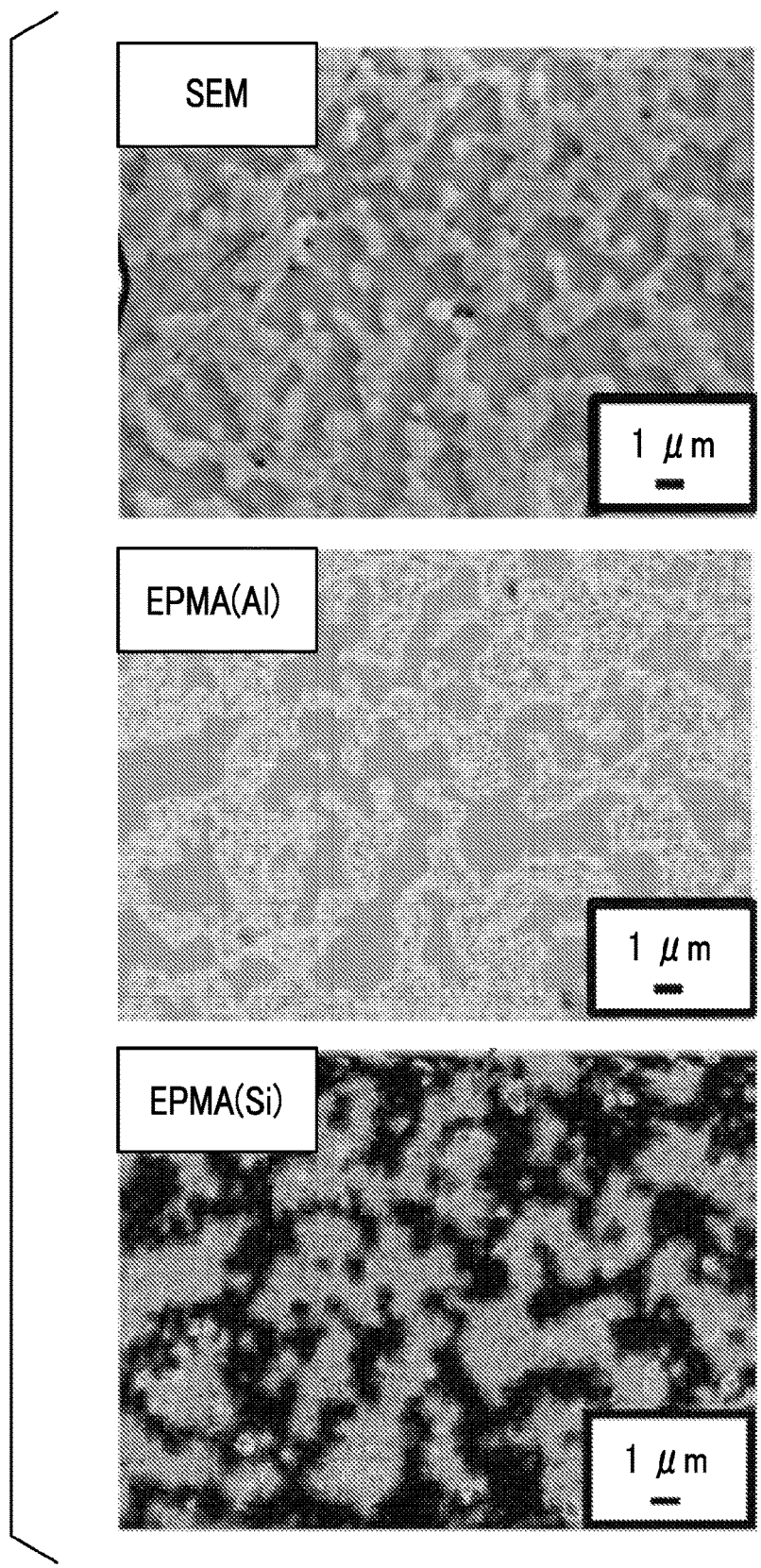
FIG. 10 is an SEM image and an EPMA image in the same field of view, of a composite sintered body of Comparative Example 1.

FIG. 9 is an SEM image and an EPMA image in the same field of view, of the composite sintered body of Example 1, and FIG. 10 is an SEM image and an EPMA image in the same field of view, of the composite sintered body of Comparative Example 1.

As shown in the drawings, in any of the composite sintered bodies, a region in which Al and Si exist at the same time can be confirmed. The region in which Al and Si exist at the same time in this manner is an agglomerate of silicate in the present invention.

Further, as is clear from FIGS. 9 and 10, in the composite sintered body of Example 1 shown in FIG. 9, the aggregation diameter of the agglomerate of silicate is smaller than that in the composite sintered body of Comparative Example 1 shown in FIG. 10. The average aggregation diameters obtained by the method described above are shown in Table 1 below.

Further, as a result of analysis, the composition of the silicate in the composite sintered body of Example 1 was $Al_7O_{14}Si_2$, and the composition of the silicate in the composite sintered body of Comparative Example 1 was $Al_8O_{12}Si_2$.

The evaluation results are shown in Table 1 below.

TABLE 1

| | Average aggregation diameter of silicate (µm) | Area ratio of silicate (%) | Average hardness (×10$^5$) (N/mm$^2$) | Average Young's modulus (×10$^5$) (N/mm$^2$) |
|---|---|---|---|---|
| Example 1 | 2.8 | 18 | 2.2 | 3.8 |
| Comparative Example 1 | 9.2 | 56 | 1.9 | 3.3 |

The surface roughness of the test piece of Example 1 obtained by the method described above was 10.2 nm before plasma exposure and 349 nm after plasma exposure.

Further, the surface roughness of the test piece of Comparative Example 1 obtained by the method described above was 10.3 nm before plasma exposure and 383 nm after plasma exposure.

As a result of the evaluation, it was found that the composite sintered body of Example 1 was superior in plasma resistance to the composite sintered body of Comparative Example 1.

Figure 13:
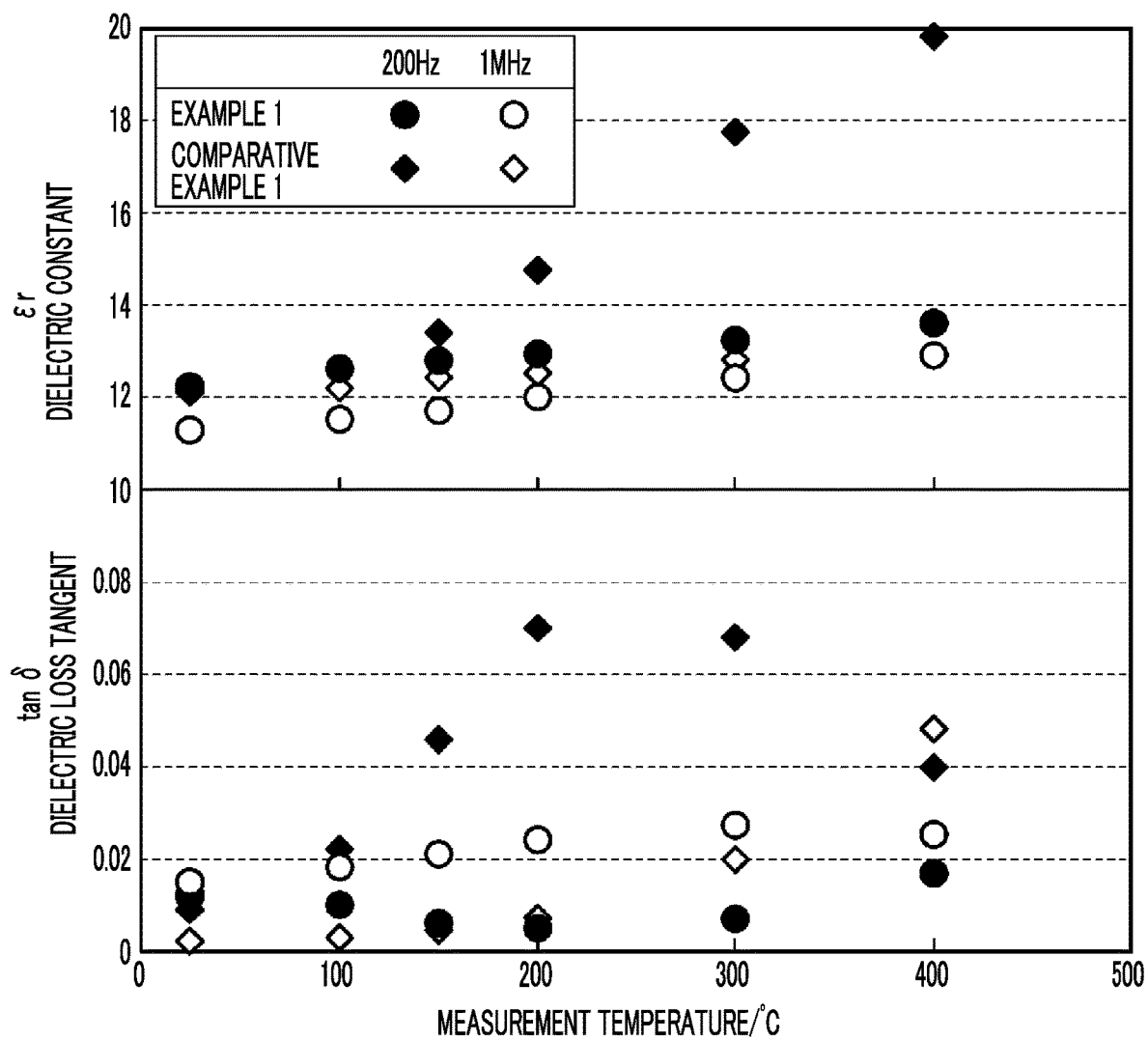
FIG. 13 is a scatter diagram showing the measurement results of a dielectric constant and a dielectric loss tangent in Example 1 and Comparative Example 1.

FIG. 13 is a scatter diagram showing the measurement results of the dielectric constant and the dielectric loss tangent in Example 1 and Comparative Example 1. The horizontal axis of the drawing represents a measurement temperature (unit: ° C.), and the vertical axis represents a relative dielectric constant ($\varepsilon_r$) and a dielectric loss tangent (tan δ).

Figure 14:
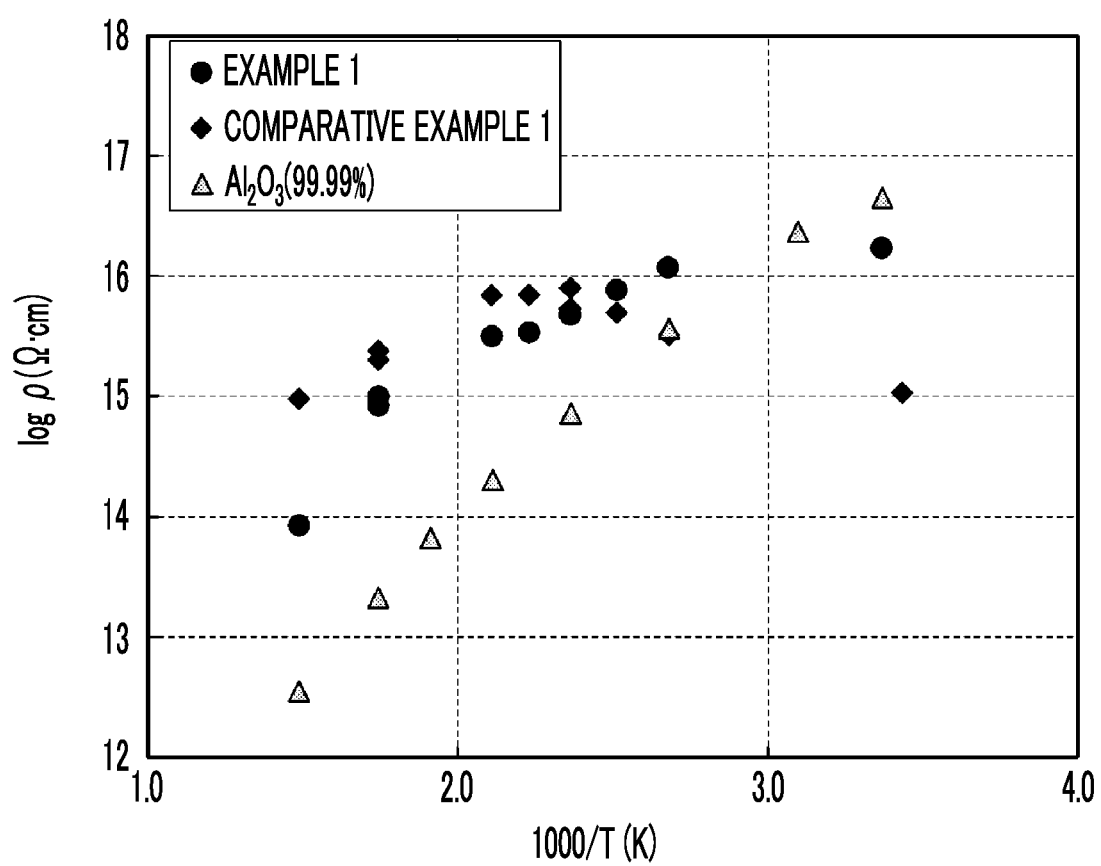
FIG. 14 is a scatter diagram showing the measurement results of a volume resistance value (volume resistivity) in Example 1 and Comparative Example 1.

FIG. 14 is a scatter diagram showing the measurement results of the volume resistance value (volume resistivity) in Example 1 and Comparative Example 1. The horizontal axis of FIG. 14 represents a reciprocal (unit: $K^{-1}$) of a measured temperature. The vertical axis represents a volume resistance value (volume resistivity) (unit: Ω·cm), that is, a logarithm log p of volume resistivity ρ (Ω·cm).

As a result of the evaluation, in the composite sintered body of Example 1, both the relative dielectric constant at 1 MHz and the relative dielectric constant at 200 Hz were 10 or higher in the entire range of 24° C. or higher and 400° C. or lower.

Further, in the composite sintered body of Example 1, both the relative dielectric constant at 1 MHz and the relative dielectric constant at 200 Hz were stable in the entire range of 24° C. or higher and 400° C. or lower. In the relative dielectric constant at 200 Hz, the difference between the maximum value and the minimum value in the range of 24° C. or higher and 400° C. or lower was 2 or lower.

Further, in the composite sintered body of Example 1, both the dielectric loss tangent at 1 MHz and the dielectric loss tangent at 200 Hz were 0.04 or lower in the entire range of 24° C. or higher and 400° C. or lower.

Further, in the composite sintered body of Example 1, the volume resistance value (volume resistivity) was $1 \times 10^{-13}$ Ω·cm or higher in the entire range of 24° C. or higher and 400° C. or lower.

In contrast, in the composite sintered body of Comparative Example 1, the values of the relative dielectric constant at 200 Hz and the dielectric loss tangent at 200 Hz significantly changed with a temperature change. In the composite sintered body of Comparative Example 1, it is considered that since the formed body obtained by uniaxial press forming was oxidized, unevenness occurs in the oxidation state of the silicon carbide particle which is the raw material of the composite sintered body and temperature dependence is expressed.

From the results of the present embodiment, it was found that the present invention is useful. From the results of the present embodiment, it was found that the composite sintered body of the present invention has both the high dielectric constant and the low dielectric loss tangent in a wide temperature range, and it was found that the present invention is useful.

INDUSTRIAL APPLICABILITY

The present invention provides a composite sintered body that is less susceptible to local plasma erosion. Further, the present invention provides an electrostatic chuck member and an electrostatic chuck device using such a composite sintered body. Further, the present invention provides a method for manufacturing a composite sintered body, which makes it possible to easily manufacture such a composite sintered body.

REFERENCE SIGNS LIST 1 electrostatic chuck device
2 electrostatic chuck part
3 temperature adjusting base part
3A flow path
3b through-hole
4 adhesion layer
5 heater element
6 adhesion layer
7 insulating plate
8 adhesive layer
10 focus ring
11 placing plate (base)
11a placing surface
11b protrusion portion
12 supporting plate (base)
13 electrostatic attraction electrode
14 insulating material layer
15 power supply terminal
15a insulator
16 through-hole
17 power supply terminal
18 tubular insulator
19 groove
20 temperature sensor
21 installation hole
22 temperature measurement part
23 excitation unit
24 fluorescence detector
25 control unit
28 gas hole
29 tubular insulator
A aluminum oxide particle
B silicon carbide particle
B1 core
B2 shell
C dispersant
D silicate
W plate-shaped sample

The invention claimed is:

1. A composite sintered body comprising:
a metal oxide as a main phase;
silicon carbide as a sub-phase; and
silicate of a metal element that is included in the metal oxide,
wherein an average aggregation diameter of the silicate in a field of view of 600 μm² at a magnification of 1000 times is 5 μm or lower.

2. The composite sintered body according to claim 1, wherein in the field of view, a ratio of an area of a region occupied by the silicate to a total area of a region occupied by the metal oxide and a region occupied by the silicon carbide is 30% or less.

3. The composite sintered body according to claim 1, wherein a portion where the silicate is aggregated has an average hardness of $2 \times 10^4$ N/mm² or higher and an average Young's modulus of $3.5 \times 10^5$ N/mm² or higher.

4. The composite sintered body according to claim 1, wherein crystal grains of the silicon carbide are
dispersed in crystal grains of the metal oxide, and dispersed at crystal grain boundaries of the metal oxide, and
a proportion of an area of the crystal grains of the silicon carbide which are dispersed in the crystal grains of the metal oxide is 25% or more with respect to a total area of the crystal grains of the silicon carbide, in terms of an area ratio.

5. The composite sintered body according to claim 1, wherein the metal oxide is aluminum oxide or yttrium oxide.

6. The composite sintered body according to claim 1, wherein an average crystal grain size of the metal oxide is 1.2 µm or higher and 10 µm or lower.

7. An electrostatic chuck member comprising:
a plate-shaped base which is formed using the composite sintered body according to claim 1 as a forming material, and which has one principal surface serving as a placing surface on which a plate-shaped sample is placed; and
an electrostatic attraction electrode provided on a side opposite to the placing surface of the base or in an interior of the base.

8. An electrostatic chuck device comprising:
the electrostatic chuck member according to claim 7.

9. The composite sintered body according to claim 1, wherein both a relative dielectric constant thereof at 200 Hz and a relative dielectric constant thereof at 1 MHz are 10 or higher in an entire range of 24° C. or higher and 400° C. or lower, and
both a dielectric loss tangent thereof at 200 Hz and a dielectric loss tangent thereof at 1 MHz are 0.04 or lower in an entire range of 24° C. or higher and 400° C. or lower.

10. A method for manufacturing a composite sintered body comprising:
a pre-oxidation step of oxidizing surfaces of silicon carbide particles;
a step of obtaining slurry that includes a dispersion medium, by injecting the silicon carbide particles treated in the pre-oxidation step and metal oxide particles at high speed to mix the silicon carbide particles and the metal oxide particles while causing the silicon carbide particles and the metal oxide particles to collide with each other;
a step of adjusting pH of the slurry so as to be included in a pH range in which surface charges of the metal oxide particles in the slurry become positive and surface charges of the silicon carbide particles in the slurry become negative, after a dispersant is added to the slurry;
a step of obtaining granules that include the metal oxide particles and the silicon carbide particles by removing the dispersion medium from the pH-adjusted slurry;
a step of oxidizing surfaces of the granules by heating the granules at a temperature of 300° C. or higher and 600° C. or lower in a non-oxidative atmosphere, and then heating the granules in an oxidative atmosphere;
a step of obtaining a formed body by forming the oxidized granules; and
a step of pressure-sintering the formed body by heating the formed body to a temperature of 1600° C. or higher while compacting the formed body at a pressure of 25 MPa or higher, in a non-oxidative atmosphere.

11. A composite sintered body comprising:
a metal oxide as a main phase; and
silicon carbide as a sub-phase,
wherein both a relative dielectric constant thereof at 200 Hz and a relative dielectric constant thereof at 1 MHz are 10 or higher in an entire range of 24° C. or higher and 400° C. or lower, and
both a dielectric loss tangent thereof at 200 Hz and a dielectric loss tangent thereof at 1 MHz are 0.04 or lower in an entire range of 24° C. or higher and 400° C. or lower.

12. The composite sintered body according to claim 11, wherein with respect to the relative dielectric constant thereof at 200 Hz, a difference between a maximum value and a minimum value in a range of 24° C. or higher and 400° C. or lower is 6 or lower.

13. The composite sintered body according to claim 11, wherein a volume resistance value thereof is $1 \times 10^{13}$ Ω·cm or higher in an entire range of 24° C. or higher and 400° C. or lower.

14. The composite sintered body according to claim 11, wherein crystal grains of the silicon carbide are
dispersed in crystal grains of the metal oxide, and dispersed at crystal grain boundaries of the metal oxide, and
a proportion of the crystal grains of the silicon carbide which are dispersed in the crystal grains of the metal oxide is 25% or more with respect to total crystal grains of the silicon carbide, in terms of an area ratio.

15. The composite sintered body according to claim 11, wherein the metal oxide is aluminum oxide or yttrium oxide.

16. The composite sintered body according to claim 11, wherein an average crystal grain size of the metal oxide is 1.2 µm or higher and 10 µm or lower.

17. An electrostatic chuck member comprising:
a plate-shaped base which is formed using the composite sintered body according to claim 11 as a forming material, and which has one principal surface serving as a placing surface on which a plate-shaped sample is placed; and
an electrostatic attraction electrode provided on a side opposite to the placing surface of the base or in an interior of the base.

18. An electrostatic chuck device comprising:
the electrostatic chuck member according to claim 17.

19. The composite sintered body according to claim 11, further comprising:
silicate of a metal element that is included in the metal oxide,
wherein an average aggregation diameter of the silicate in a field of view of 600 µm² at a magnification of 1000 times is 5 µm or lower.

* * * * *